(12) United States Patent
Hayashi

(10) Patent No.: US 7,512,051 B2
(45) Date of Patent: Mar. 31, 2009

(54) INFORMATION PROCESSING APPARATUS

(75) Inventor: Tsuneo Hayashi, Chiba (JP)

(73) Assignee: Sony Corporation (JP)

( * ) Notice: Subject to any disclaimer, the term of this patent is extended or adjusted under 35 U.S.C. 154(b) by 775 days.

(21) Appl. No.: 10/941,926

(22) Filed: Sep. 16, 2004

(65) Prior Publication Data

US 2005/0073931 A1 Apr. 7, 2005

(30) Foreign Application Priority Data

Sep. 26, 2003 (JP) ............................ P2003-334964
Sep. 26, 2003 (JP) ............................ P2003-334974
Sep. 26, 2003 (JP) ............................ P2003-334984

(51) Int. Cl.
G11B 20/14 (2006.01)
(52) U.S. Cl. ................. 369/59.2; 369/53.34; 369/47.28
(58) Field of Classification Search ........................ None
See application file for complete search history.

(56) References Cited

U.S. PATENT DOCUMENTS

| | | | |
|---|---|---|---|
| 4,466,089 A | 8/1984 | Wachi | |
| 4,724,496 A | 2/1988 | White | |
| 4,760,566 A * | 7/1988 | Kobayashi et al. | 369/47.23 |
| 4,835,759 A * | 5/1989 | Saito et al. | 369/59.2 |
| 5,442,618 A * | 8/1995 | Dewey et al. | 369/53.33 |
| 6,020,768 A | 2/2000 | Lim | |
| 7,224,659 B2 * | 5/2007 | Wada | 369/53.35 |

FOREIGN PATENT DOCUMENTS

| | | |
|---|---|---|
| EP | 0 477 892 A2 | 4/1992 |
| JP | 58-003118 | 1/1983 |
| JP | 01-314421 A | 12/1989 |
| JP | 02-116129 U | 9/1990 |
| JP | 05-138747 | 6/1993 |
| JP | 06-012790 | 1/1994 |

(Continued)

OTHER PUBLICATIONS

EPO Search Report dated Feb. 11, 2005.

(Continued)

Primary Examiner—Joseph H Feild
Assistant Examiner—Christopher R. Lamb
(74) Attorney, Agent, or Firm—Rader Fishman & Grauer PLLC; Ronald P. Kananen

(57) ABSTRACT

An information processing apparatus capable of reducing propagation delay differences and error factors, capable of realizing high precision binarization control, and accordingly capable of realizing high precision reproduction, including a comparator for converting an RF signal to a binarized signal; an edge position measurement unit for measuring the edge position of the binarized signal in a time axis by multi-phase clocks; a jitter measurement unit for measuring the amount of jitter based on the edge position information; an edge interval measurement unit for measuring the edge interval length based on the edge position information; a propagation delay difference control amount calculation unit for controlling propagation delay amount between an input and an output of the comparator by injecting a slice level voltage of the comparator through a DAC based on the measured amount of jitter and edge interval length; and a channel data discrimination unit for reproducing the data corresponding to the channel clock based on the edge position information.

6 Claims, 32 Drawing Sheets

FOREIGN PATENT DOCUMENTS

| | | |
|---|---|---|
| JP | 07-153198 | 6/1995 |
| JP | 09-083321 | 3/1997 |
| JP | 10-134511 | 5/1998 |
| JP | 11-073733 | 3/1999 |
| JP | 11-134800 | 5/1999 |
| JP | 3150107 | 4/2000 |
| JP | 2000-173168 | 6/2000 |
| JP | 2000-251419 | 9/2000 |
| JP | 2001-075671 | 3/2001 |
| JP | 2001-250334 | 9/2001 |
| JP | 2001-332028 | 11/2001 |
| JP | 2001-357531 | 12/2001 |
| JP | 2002-042344 | 2/2002 |
| JP | 3450293 | 6/2002 |
| JP | 2005-100555 | 4/2005 |
| JP | 2005-100556 | 4/2005 |
| JP | 2005-100557 | 4/2005 |
| WO | WO-02/089123 | 11/2002 |

OTHER PUBLICATIONS

Japanese Office Action dated Jan. 22, 2008 for corresponding Japanese Application No. 2003-334964.
Japanese Office Action dated Apr. 22, 2008 for coresponding Japanese Application No. 2003-334984.
Japanese Office Action dated Apr. 22, 2008 for corresponding Japanese Application No. 2003-334974.
Japanese Office Action dated Jan. 22, 2008 for corresponding Japanese Application No. 2003-334984.
Japanese Office Action dated Jan. 22, 2008 for corresponding Japanese Application No. 2003-334974.
Decision of Refusal drafted on Jul. 10, 2008 (Japan).

* cited by examiner

FIG. 2A  RFAC

FIG. 2B  CMPOUT

PRIOR ART

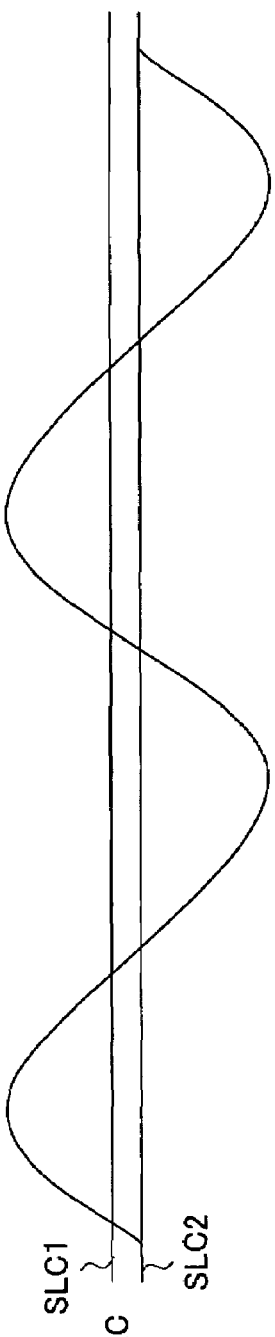
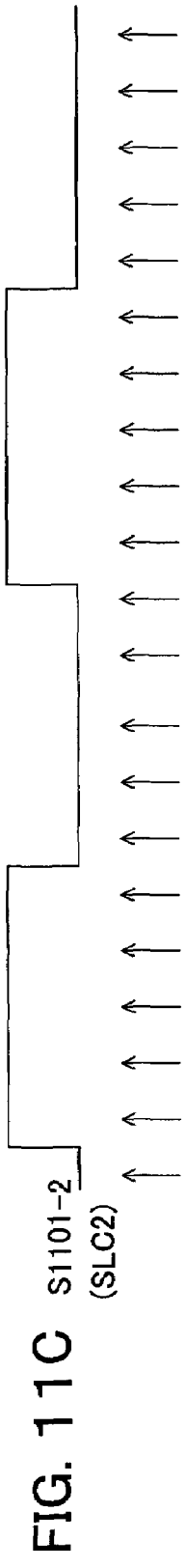
FIG. 11A RFAC SLC1 SLC2
FIG. 11B S1101-1 (SLC1)
FIG. 11C S1101-2 (SLC2)

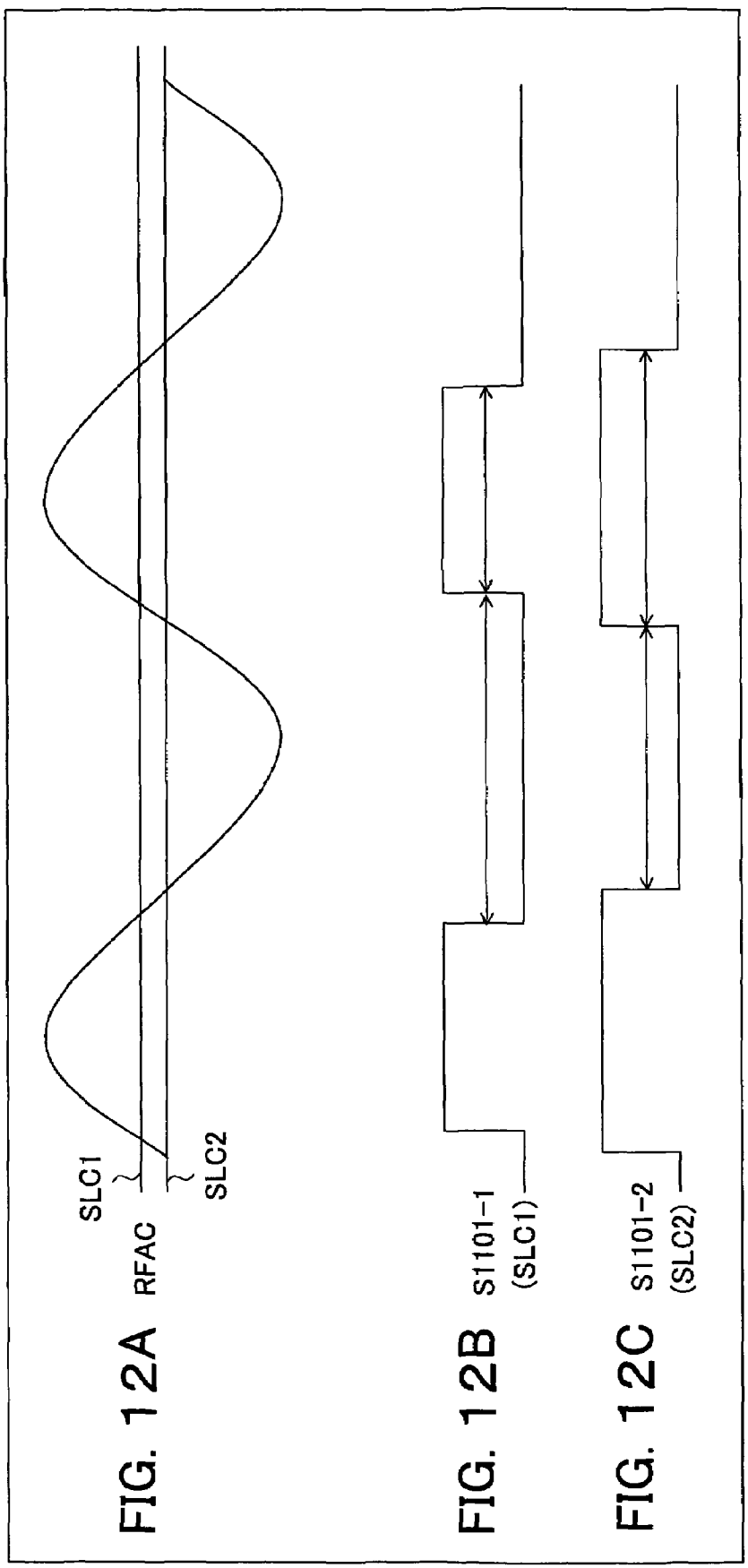

INFORMATION PROCESSING APPARATUS

BACKGROUND OF THE INVENTION

1. Field of the Invention

The present invention relates to an information processing apparatus for reproducing and performing decoding and decode processing information of a recording medium in an optical disc device etc., and more particularly relates to the configuration of a binarization circuit unit used for reproducing the information.

2. Description of the Related Art

In a digital versatile disc (DVD) or other optical disc recording medium, a string of digital information is recorded with the direct current (DC) component suppressed. For this reason, in principle, if binarizing the reproduced RF signal while stripping the DC component by AC coupling, the information of the disc recording medium can be read out.

Specifically, the digital information recorded on the disc recording medium is read by an optical pick-up and subjected to predetermined processing in an RF amplifier to obtain a data string signal (RF signal). This data string signal (RF signal) is then binarized in a binarization circuit. The clock is extracted based on the RF signal binarized in the binarization circuit, supplied as digital binary data (RF data) to an eight to fourteen modulation (EFM) demodulation circuit, and demodulated.

Various proposals have been made regarding the binarization circuit used for reproducing the information of a disc recording medium in an optical disc device etc. (refer to for example Japanese Unexamined Patent Publication (Kokai) No. 11-134800).

FIG. 1 is a circuit diagram of an example of the configuration of a binarization circuit applied to an optical disc. This binarization circuit 1, as shown in FIG. 1, has a comparator 2, a low pass filter (LPF) 3, a slice level feedback amplifier 4, coupling capacitors C1 and C2 for eliminating the direct current component (DC component), resistor elements R1 to R4, variable resistor elements R5 and R6, and capacitors C3 to C6.

The binarization circuit 1 cuts the DC components from the differential RF signals by the coupling capacitors C1 and C2, inputs the results to the comparator 2 as signals RFAC and XRFAC, and binarizes them by the comparator 2. The binarized signals are supplied to a not illustrated PLL (Phase Locked Loop) and LPF 3. The PLL performs data reproduction. The LPF 3 integrates the binarized signals to generate an average value ASY1 of the binarized signals. The average value of the binarized signals, where an H level of the binarized signal is Vh, and an L level is Vl, is given as Vc=(Vh−Vl)/2 in an ideal state. In actuality, the value becomes different from the ideal state, so the level of the signal ASY1 does not coincide with the ideal average value Vc. By defining a voltage value obtained by amplifying the difference between the average value signal ASY1 and the ideal average value Vc as the slice level at the slice level feedback amplifier 4 and feeding back it to the comparator 2, the difference from the ideal state is controlled to become zero (0).

In this configuration, however, there have been the problems as pointed out below. All have been factors degrading the reproduction state.

Namely, when binarizing the RF signal, there was a difference in the propagation delays DLYR and DLYF at the time of the rising edge and at the time of the falling edge as shown in FIGS. 2A and 2B (the difference of the propagation delay between the time of the rising edge and the time of the falling edge will be referred to as the "propagation delay difference"). Further, as shown in FIG. 3, at an input node ASYO of the binarized signal to the LPF 3, it became a factor of waveform disturbance such as overshoot, undershoot, and waveform bluntness and error in the average value signal ASY1. Further, the reference voltage Vc for comparison with the average value signal ASY1 varied at the time of mass production and became a factor of error. In the same way as above, an input offset voltage of the feedback amplifier 4 varied at the time of mass production and became the factor of error. Further, the input offset voltage of the comparator 2 varied at the time of the mass production and became a factor of error. Further, due to temperature fluctuation, voltage fluctuation, aging, etc., various types of error factors fluctuated, so control at the time of shipping was difficult. Further, the feedback is controlled so that lengths of the H level and the L level have the same value at the node ASYG. However, the propagation delay difference in a path reaching the PLL from a branch point CMPOUT and the propagation delay difference in a path reaching the node ASYG from the branch point CMPOUT do not coincide, therefore, even in the optimum state at the node ASYO, the signal input to the PLL was not the optimum state. Namely, the feedback was not applied so that the signal became the best at the input point to the PLL.

SUMMARY OF THE INVENTION

An object of the present invention is to provide an information processing apparatus capable of reducing the propagation delay difference and error factors, capable of realizing high precision binarization control, and accordingly capable of realizing high precision reproduction.

According to a first aspect of the present invention, there is provided an information processing apparatus for reading and reproducing recording data from a medium recording data of a predetermined format therein, comprising a binarizing means for binarizing read data from the medium; a reproduction state evaluating means for evaluating the reproduction state of the read data; a propagation delay difference control amount calculating means for calculating an amount for controlling the propagation delay difference as the difference between a rising propagation delay and a falling propagation delay of the binarized data from the reproduction state evaluation value of the reproduction state evaluating means; and a controlling means for controlling the difference between the rising propagation delay and the falling propagation delay of the binarized data based on the control amount from the propagation delay difference control amount calculating means.

According to a second aspect of the present invention, there is provided an information processing apparatus for reading and reproducing recording data from a medium recording data of a predetermined format therein, comprising a binarizing means for binarizing read data from the medium; an edge measuring means for measuring an edge position of the binarized data from the binarizing means; a jitter measuring means for measuring coded jitter information from the measured edge position; a controlling means for controlling a difference between rising propagation delay and falling propagation delay of the binarized data based on the jitter information from the jitter measuring means; and a channel data discriminating means for discriminating a channel data from the measured edge position.

According to a third aspect of the present invention, there is provided an information processing apparatus for reading and reproducing recording data from a medium recording data of a predetermined format therein, comprising a binarizing means for binarizing read data from the medium; an edge measuring means for measuring an edge position of the binarized data from the binarizing means; an edge interval measuring means for measuring the edge interval from the measured edge position; a controlling means for controlling the difference between a rising propagation delay and a falling propagation delay of the binarized data based on the edge interval from the edge interval measuring means; and a channel data discriminating means for discriminating a channel data from the measured edge position.

According to a fourth aspect of the present invention, there is provided an information processing apparatus for reading and reproducing recording data from a medium recording data of a predetermined format therein, comprising a binarizing means for binarizing read data from the medium; an edge measuring means for measuring an edge position of the binarized data from the binarizing means; a jitter measuring means for measuring the coded jitter information from the measured edge position; an edge interval measuring means for measuring an edge interval from the measured edge position; a controlling means for controlling the difference between a rising propagation delay and a falling propagation delay of the binarized data based on the jitter information from the jitter measuring means and the edge interval from the edge interval measuring means; and a channel data discriminating means for discriminating the channel data from the measured edge position.

According to a fifth aspect of the present invention, there is provided an information processing apparatus for reading recording data from a medium recording data of a predetermined format therein and recording the input data as the data of a predetermined format on the medium, comprising a binarizing means for binarizing read data from the medium; an edge measuring means for measuring an edge position of the binarized data from the binarizing means; a jitter measuring means for measuring the coded jitter information from the measured edge position; a controlling means for controlling the difference between the rising propagation delay and the falling propagation delay of the binarized data based on the jitter information from the jitter measuring means; a channel data discriminating means for discriminating the channel data from the measured edge position; a demodulation circuit for demodulating the read data from the channel data discriminating means; a processing circuit for performing predetermined decode processing and encode processing of an error correction code with respect to the data after the demodulation; a modulation circuit for modulating the encoded data and outputting the same as the recording data to the medium; a memory portion including at least one memory capable of storing data having at least a capacity required in the each pipeline stage and accessed by any circuit of the demodulation circuit, processing circuit, and modulation circuit; and a bus portion for switching a data path between the demodulation circuit and processing circuit and the memory of the memory portion in accordance with predetermined status information and performing the transfer of the data between pipeline stages.

According to a sixth aspect of the present invention, there is provided an information processing apparatus for reading recording data from a medium recording data of a predetermined format therein and recording the input data as the data of the predetermined format on the medium, comprising a binarizing means for binarizing read data from the medium; an edge measuring means for measuring an edge position of the binarized data by the binarizing means; an edge interval measuring means for measuring the edge interval from the measured edge position; a controlling means for controlling the difference between the rising propagation delay and the falling propagation delay of the binarized data based on the edge interval from the edge interval measuring means; a channel data discriminating means for discriminating the channel data from the measured edge position; a demodulation circuit for demodulating the read data by the channel data discriminating means; a processing circuit for performing a predetermined decode processing and encode processing of an error correction code with respect to the data after the demodulation; a modulation circuit for modulating the encoded data and outputting the same as the recording data to the medium; a memory portion including at least one memory capable of storing data having at least a capacity required in the each pipeline stage and accessed by any circuit of the demodulation circuit, processing circuit, and modulation circuit; and a bus portion for switching a data path between the demodulation circuit and processing circuit and the memory of the memory portion in accordance with predetermined status information and performing the transfer of the data between pipeline stages.

According to a seventh aspect of the present invention, there is provided an information processing apparatus for reading recording data from a medium recording data of a predetermined format therein and recording the input data as the data of the predetermined format on the medium, comprising a binarizing means for binarizing read data from the medium; an edge measuring means for measuring an edge position of the binarized data from the binarizing means; a jitter measuring means for measuring the coded jitter information from the measured edge position; an edge interval measuring means for measuring the edge interval from the measured edge position; a controlling means for controlling the difference between the rising propagation delay and the falling propagation delay of the binarized data based on the jitter information from the jitter measuring means and the edge interval from the edge interval measuring means; a channel data discriminating means for discriminating the channel data from the measured edge position; a demodulation circuit for demodulating the read data from the channel data discriminating means; a processing circuit for performing a predetermined decode processing and encode processing of an error correction code with respect to the data after the demodulation; a modulation circuit for modulating the encoded data and outputting the same as the recording data to the medium; a memory portion including at least one memory capable of storing data having at least a capacity required in the each pipeline stage and accessed by any circuit of the demodulation circuit, processing circuit, and modulation circuit; and a bus portion for switching a data path between the demodulation circuit and processing circuit and the memory of the memory portion in accordance with predetermined status information and performing the transfer of the data between pipeline stages.

That is, according to the present invention, for example the binarizing means converts the read data from the medium to binary data and outputs it to the edge position measuring means. The edge position measuring means measures the edge position in a time axis of the binarized data and outputs the measurement result as the edge position information to the channel data discriminating means, the jitter measuring means, and the edge interval measuring means. The channel data discriminating means reproduces the data corresponding to the channel clock based on the edge position information from the edge position measuring means. The jitter measuring means measures the amount of jitter based on the edge position information by the edge position measuring means and outputs the result to the controlling means. The edge interval measuring means measures the edge interval length based on the edge position information from the edge position measuring means and outputs the result to the controlling means. Then, the controlling means controls the propagation delay difference of the binarized data by controlling for example the slice level of the binarizing means based on the jitter information from the jitter measuring means and the edge interval length from the edge interval measuring means.

According to the present invention, due to the following advantages, the reproduction state is enhanced, production becomes easy, and the cost becomes low. Namely, the signal input to the channel data discrimination unit and the signal used for calculating the propagation delay difference control amount have the same precision, therefore making the propagation error measurement amount zero it leads to the best channel data discrimination precision and thus high precision control can be carried out. Further, even if there is temperature fluctuation, voltage fluctuation, aging, etc. of the analog circuit components, the correction can be carried out while performing the signal reproduction. Further, variations in production of the analog circuit components can be corrected. Further, the control is carried out by digital processing without using the waveform information of the signal, so there are few error factors. Still further, there are a few components realized by analog circuits.

BRIEF DESCRIPTION OF THE DRAWINGS

These and other objects and features of the present invention will become clearer from the following description of the preferred embodiments given with reference to the attached drawings, wherein:

FIGS. 11A to 11C are diagrams for explaining inversion processing of an amount of jitter in the propagation delay difference control amount calculation unit according to an embodiment of the present invention;

FIGS. 12A to 12C are diagrams for explaining inversion processing of an edge interval length in the propagation delay difference control amount calculation unit according to an embodiment of the present invention;

DESCRIPTION OF THE PREFERRED EMBODIMENTS

Below, a detailed explanation will be given of preferred embodiments of the present invention with reference to the attached drawings. In the embodiments, the explanation will be given taking as an example an optical disc recording/reproducing apparatus, specifically a DVD recording/reproducing system, as the information processing apparatus.

Figure 4:
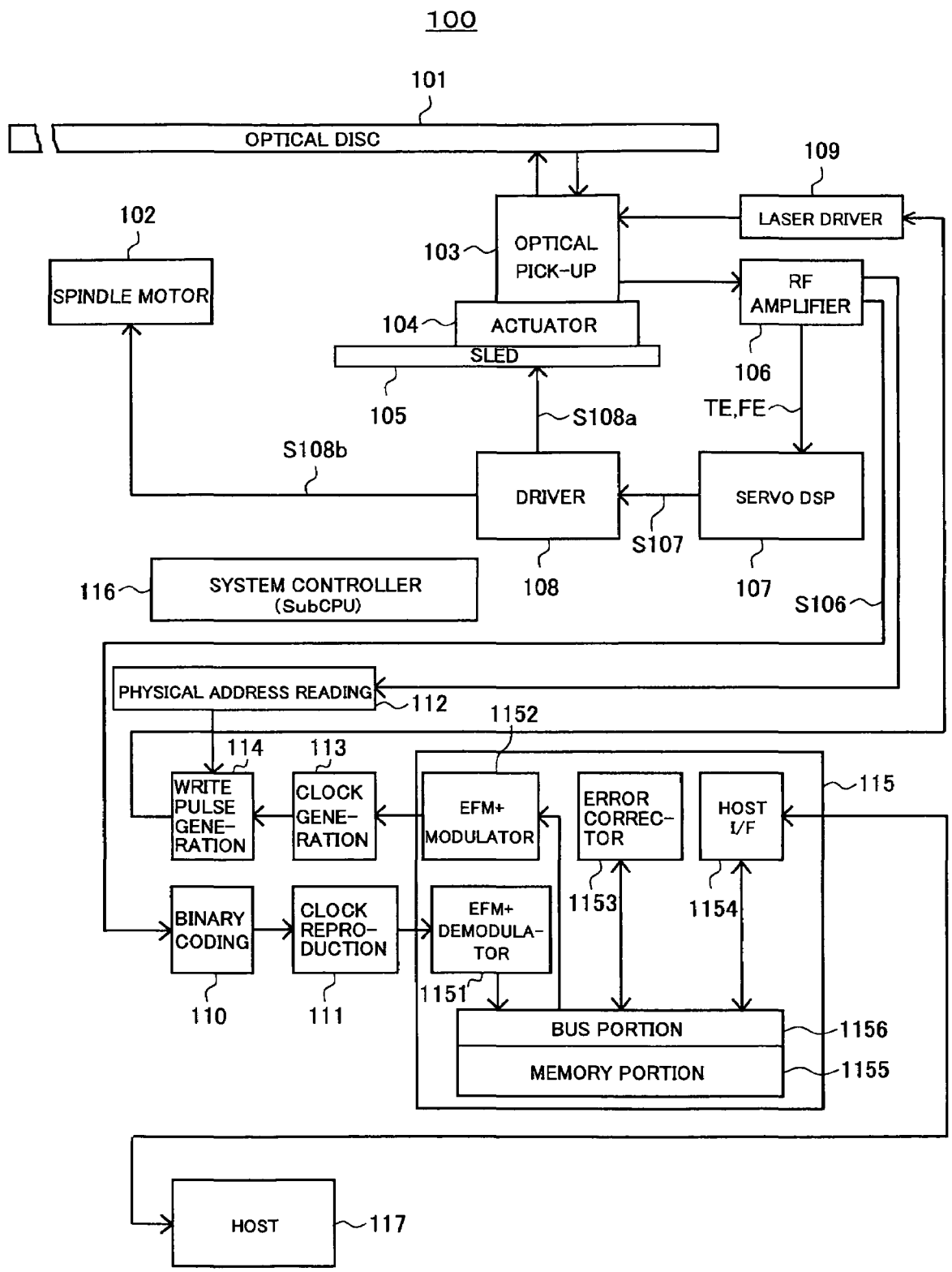
FIG. 4 is a block diagram of a DVD recording/reproducing apparatus as an information processing apparatus according to an embodiment of the present invention.

FIG. 4 is a block diagram of an optical disc recording/reproducing apparatus as an information processing apparatus employing a binarization circuit according to an embodiment of the present invention.

The optical disc recording/reproducing apparatus 100 has, as shown in FIG. 4, an optical disc (hereinafter simply referred to as a disc) 101, a spindle motor 102, an optical pick-up 103, an actuator 104, a sled mechanism 105, an RF amplifier 106, a servo digital signal processor (servo DSP) 107, a driver circuit 108, a laser driver 109, a binarization circuit 110, a clock reproduction circuit 111, a physical address reading circuit 112, a clock generation circuit 113, a write pulse generation circuit 114, a decoder/encoder circuit (DEC/ENC) 115, a system controller 116, and a host apparatus 117.

This optical disc recording/reproducing apparatus 100 can decode data read from the optical disc 101 at the decoder/encoder circuit 115 as explained later, then transfer it through the host interface circuit to a personal computer (PC) or other host apparatus 117. On the other hand, it can receive data from the host apparatus 117 through the host interface circuit and, as will be explained later, encode it at the decoder/encoder circuit (DEC/ENC) 115 and record it on the disc 101. Note that the embodiment, as an example, shows a system configuration showing connection with a PC as the host apparatus, but the invention can not only be applied to a PC, but any of a video player, a tuner, a game machine, a telephone, a network device, a video recorder, a car navigation system, or other apparatus so long as it handles data.

Figure 5:
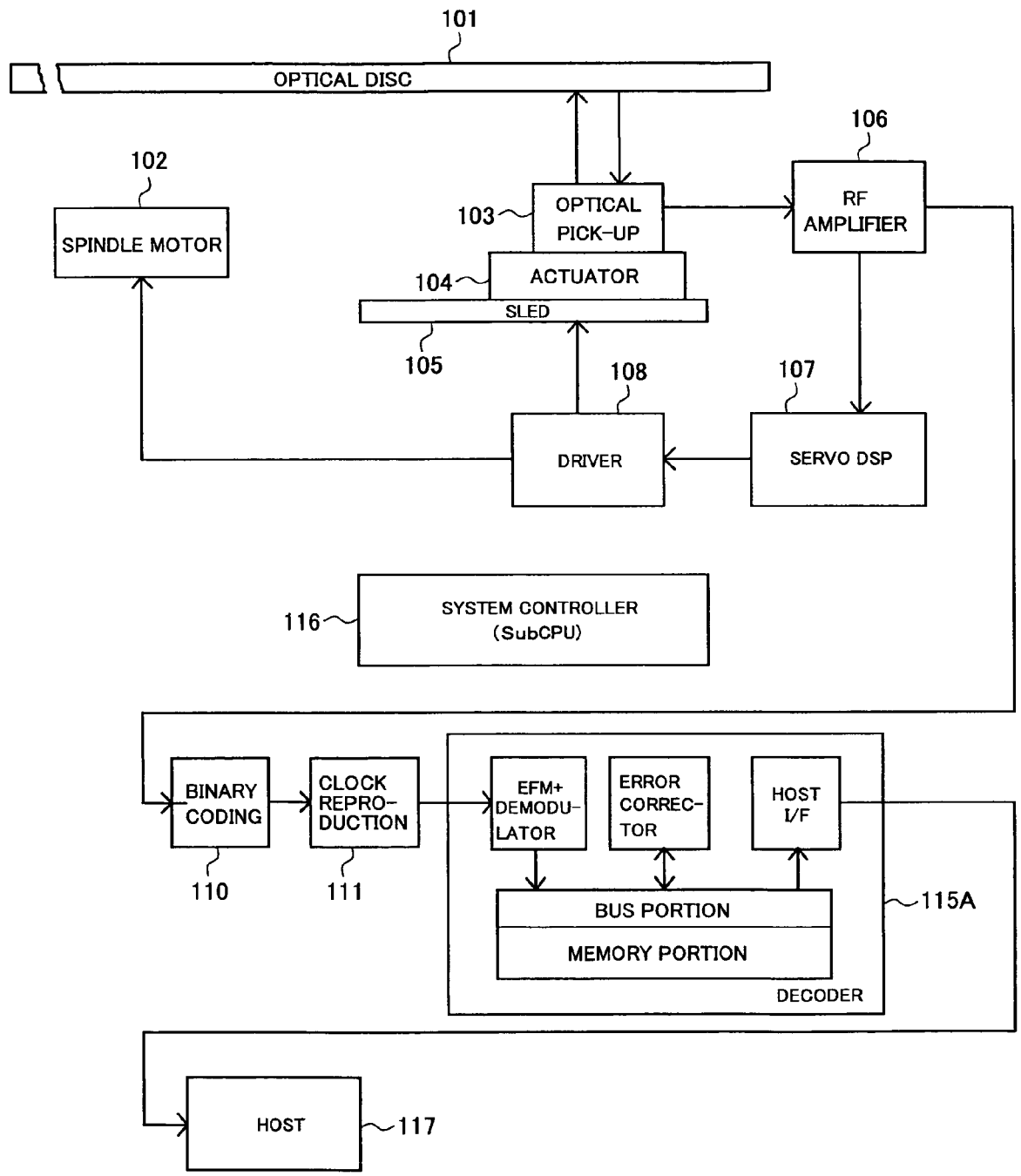
FIG. 5 is a block diagram of a DVD player as an information processing apparatus according to an embodiment of the present invention.
Figure 6:
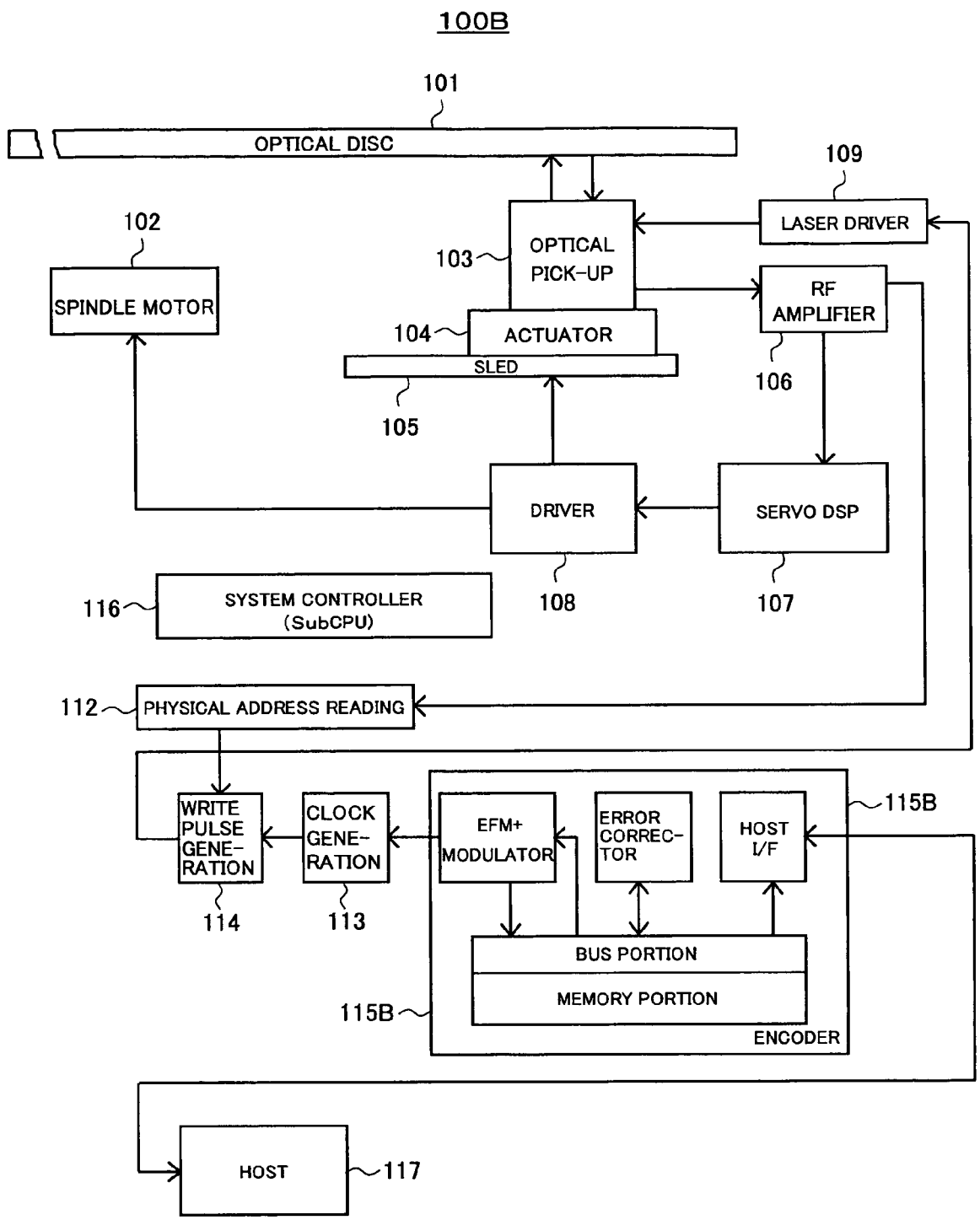
FIG. 6 is a block diagram of a DVD recorder as an information processing apparatus according to an embodiment of the present invention.

Further, it is also possible to configure a system which only reproduces data as shown in FIG. 5 or only records data as shown in FIG. 6. An optical disc reproducing apparatus 100A of FIG. 5 is for example configured by the circuit of FIG. 4 minus the laser driver 109, the physical address reading circuit 112, the clock generation circuit 113, and the write pulse generation circuit 114 required for a recording system. Further, the decoder/encoder circuit 115 is configured by only a decoding circuit 115A. An optical disc recording apparatus 100B of FIG. 6 is for example configured by the circuit of FIG. 4 minus the binarization circuit 110 and the clock reproduction circuit 111 required for a reproduction system. Further, the decoder/encoder circuit 115 is configured by only an encoder circuit 115B.

The following explanation is only an example. Many modifications are possible in the system. The present invention is not limited to the system of the following explanation.

Below, an outline of parts of the optical disc recording/reproducing apparatus 100 and the concrete configurations and functions of the DVD data format, the binarization circuit 110 characterizing the present invention, and in addition the decoder/encoder circuit (DEC/ENC) 115 for performing the predetermined pipeline processing at the time of reproduction and the time of recording will be successively described with reference to the drawings.

The disc 101 is driven to rotate by the spindle motor 102. The disc 101 is scanned by a laser beam from the optical pick-up 103. The disc 101 reflects part or all of the light of the laser beam. The optical pick-up 103 has a laser diode, an object lens for focusing the laser beam emitted from this laser diode to a signal recording surface of the disc 101, a polarization beam splitter for changing a direction of the light reflected from the optical disc 101, a photo-detector for receiving this reflected light, etc. and is controlled in its movement in an optical axis direction of the object lens or a disc radius direction by the actuator 104 and the sled mechanism 105 driven by a drive signal S108a of the driver circuit 108. The optical pick-up 103 converts the reflected signal light to an electric signal at the photo-detector and outputs the signal to the RF amplifier 106. At this time, the amount of light incident upon the optical pick-up 103 differs due to the structure and physical properties of the disc 101, therefore a signal reflecting the structure and the physical properties of the disc is transferred to the RF amplifier 106.

The actuator 104 is controlled in drive by the drive signal S108a of the driver circuit 108 and includes a tracking actuator for moving the spot formed by the laser beam with respect to the recording tracks of the disc 101 in the disc radius direction and a focus actuator for moving the object lens of the optical pick-up 103 in the optical axis direction. The sled mechanism 105 moves the optical pick-up 103 and the actuator 104 in the disc radius direction using the sled feed motor controlled in drive by the drive signal S108a of the driver circuit 108 as the drive source.

The RF amplifier 106 performs operation on the plurality of signals transferred from the optical pick-up 103, generates the tracking error signal TE and the focus error signal FE and outputs them to the servo DSP 107, shapes the waveform of the data string signal (RF signal), and outputs the result as a signal S106 to the binarization circuit 110. Further, the RF amplifier 106 outputs a signal for reading the physical address based on the reflected light of the disc 101 to the physical address reading circuit 112 at the time of recording data on the disc 101.

The servo DSP 107 uses the tracking error signal TE and the focus error signal FE generated at the RF amplifier 106 for the focus servo, tracking servo, and sled servo control. The servo DSP 107 performs filter processing on the tracking error signal TE and the focus error signal FE by the digital filter and outputs a control signal S107 to the driver circuit 108.

The driver circuit 108 generates a drive signal S108a in accordance with a control signal S107 from the servo DSP 107, supplies a current or voltage to the actuator 104 of the optical pick-up 103, moves the optical pick-up 103 in the focus direction or the track direction, and moves the sled 105. By this, the beam spot is controlled to the reading position on the disc 101.

Further, the amount of rotation of the spindle motor 102 is controlled to become constant by monitoring the frequency and the phase of the extracted clocks. Alternatively, it is controlled to become constant by for example the control signal S108b of the driver circuit 108 by monitoring the frequency and the phase of the rotation position information output from the spindle motor 102.

The laser driver circuit 109 drives the laser diode of the optical pick-up 103 so as to record the desired data in accordance with a write pulse generated at the write pulse generation circuit 114 for example at the time of recording data on the disc 101.

The binarization circuit 110 binarizes the RF signal S106 from the RF amplifier 106 and outputs the result to the clock reproduction circuit 111.

Here, an explanation will be given of the concrete configuration of the binarization circuit 110 as the characterizing feature of the present invention with reference to the drawings.

Figure 7:
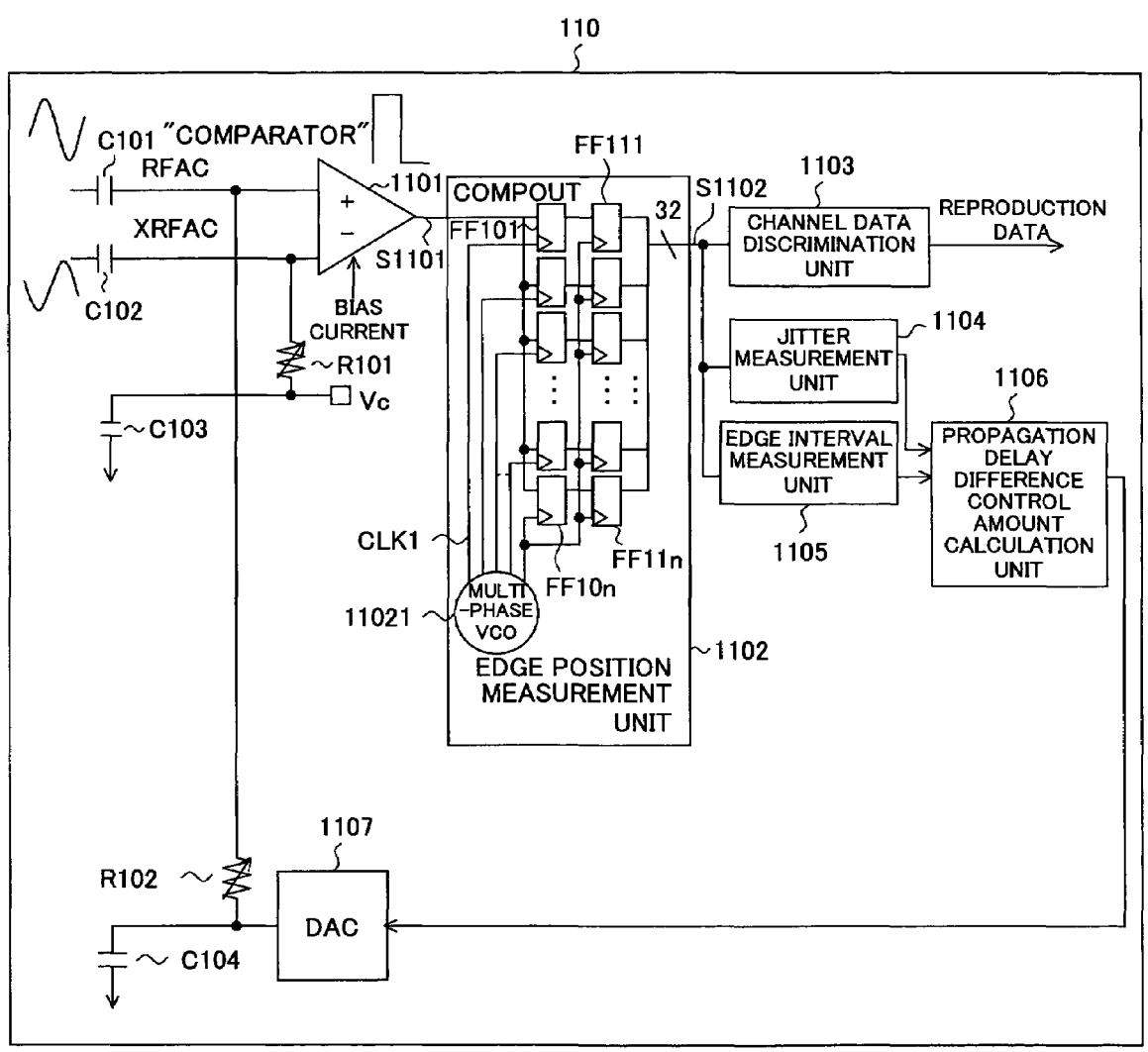
FIG. 7 is a block diagram of an example of the configuration of a binarization circuit according to an embodiment of the present invention.

FIG. 7 is a block diagram of an example of the configuration of the binarization circuit according to the present embodiment. This binarization circuit 110, as shown in FIG. 7, has a comparator 1101, an edge position measurement unit 1102, a channel data discrimination unit 1103, a jitter measurement unit 1104, an edge interval measurement unit 1105, a propagation delay difference control amount calculation unit 1106, a digital/analog converter (DAC) 1107, coupling capacitors C101 and C102 for eliminating the DC component, capacitors C103 and C104, and variable resistor elements R101 and R102.

The binarization circuit 110 receives the differential RF signal S106 from the RF amplifier 106, removes the DC component by the coupling capacitors C101 and C102, and inputs the result as a forward phase signal RFAC and an inverse phase signal XRFAC to the comparator 1101. Here, where the RF signal S106 is output in one phase from the RF amplifier 106, the XRFAC is connected to a ground line GND via the coupling capacitor C102. The comparator 1101 converts the forward phase signal RFAC and the inverse phase signal XRFAC to the binarized data (signal) S1101 which it then outputs to the edge position measurement unit 1102.

The edge position measurement unit 1102 has a multi-phase (n-phase) voltage controlled oscillator (VCO) 11021, n number of flip-flops FF101 to FF10n arranged in parallel with respect to the input of the binarized signal S1101, and n number of flip-flops FF111 to FF11n arranged corresponding to outputs of the flip-flops FF11 to FF1n.

The edge position measurement unit 1102 measures the edge position in the time axis of the binarized signal S1101 supplied from the comparator 1101 by the multi-phase clock from the multi-phase VCO 11021. Assume that the multi-phase VCO 11021 has for example 32 phases of output clocks CLK1 to CLK32 and assume that the edge position interval between adjacent phases is equal between all phases. The frequency of the multi-phase VCO 11021 is controlled so as to become for example a channel clock frequency. At this time, the measured edge position precision becomes 1/32 T. Here, 1 T is the channel clock cycle. Note that VOC does not have to be a multi-phase VCO, the frequency of the VCO does not always have to be the channel clock frequency and may be a whole multiple thereof or a fraction thereof or further a frequency having absolutely no relationship with the channel clock frequency. It is sufficient that the edge position can be measured with a sufficiently high precision with respect to the channel clock frequency. The edge position measurement unit 1102 outputs the edge position information S1102 measured with the precision of 1/32 T to the channel data discrimination unit 1103, the jitter measurement unit 1104, and the edge interval measurement unit 1105.

The channel data discrimination unit 1103 is a type of PLL and is also referred to as a "digital PLL". The channel data discrimination unit 1103 reproduces the data corresponding to the channel clock based on the edge position information S1102 from the edge position measurement unit 1102 and outputs it to the clock reproduction circuit 111.

Figure 8:
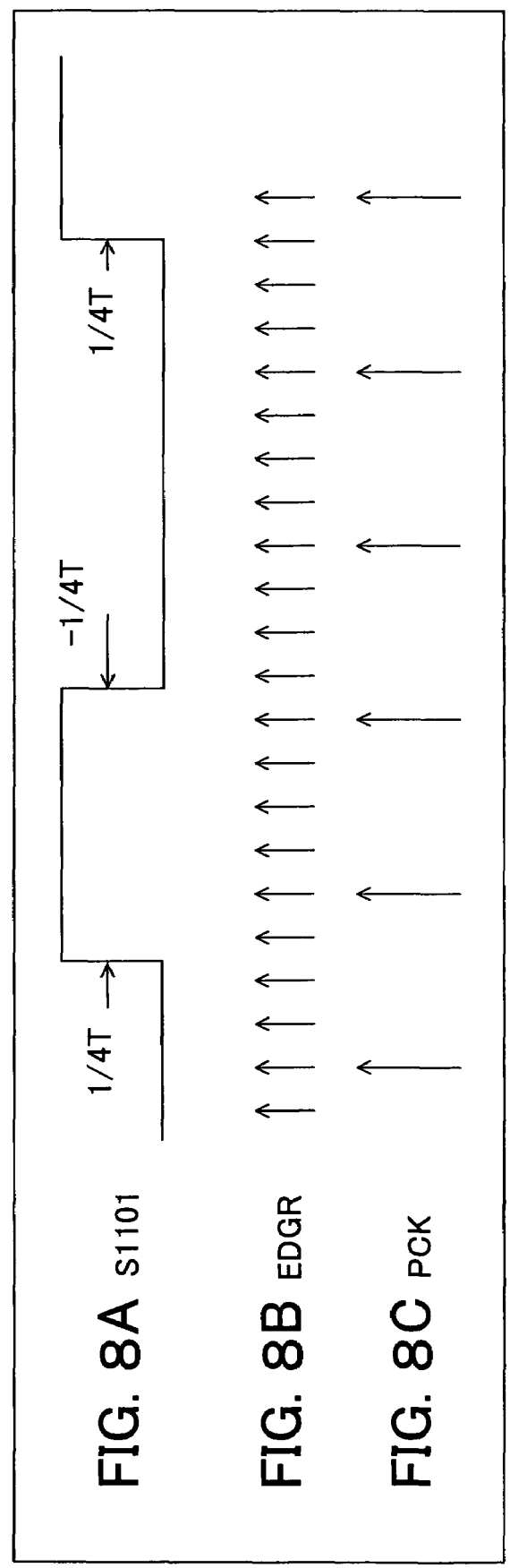
FIGS. 8A to 8C are diagrams showing the state of measurement of the amount of jitter in the case of using a quadrature clock in a jitter measurement unit according to an embodiment of the present invention.

The jitter measurement unit 1104 measures the amount of jitter based on the edge position information S1102 from the edge position measurement unit 1102 and outputs the result to the propagation delay difference control amount calculation unit 1106. At this time, the binarized signal polarity is input to the propagation delay difference control amount calculation unit 1106. Here, "jitter" means the amount of deviation between the ideal position and actual position of the binarized signal at the time of data discrimination by the channel clock. FIGS. 8A to 8C are diagrams showing the state of measurement of jitter when using quadrature clocks. FIG. 8A shows the binarized signal S1101, FIG. 8B shows a rising edge EDGR of the multi-phase clocks CLKn, and FIG. 8C shows a channel clock position PCK.

Figure 9:
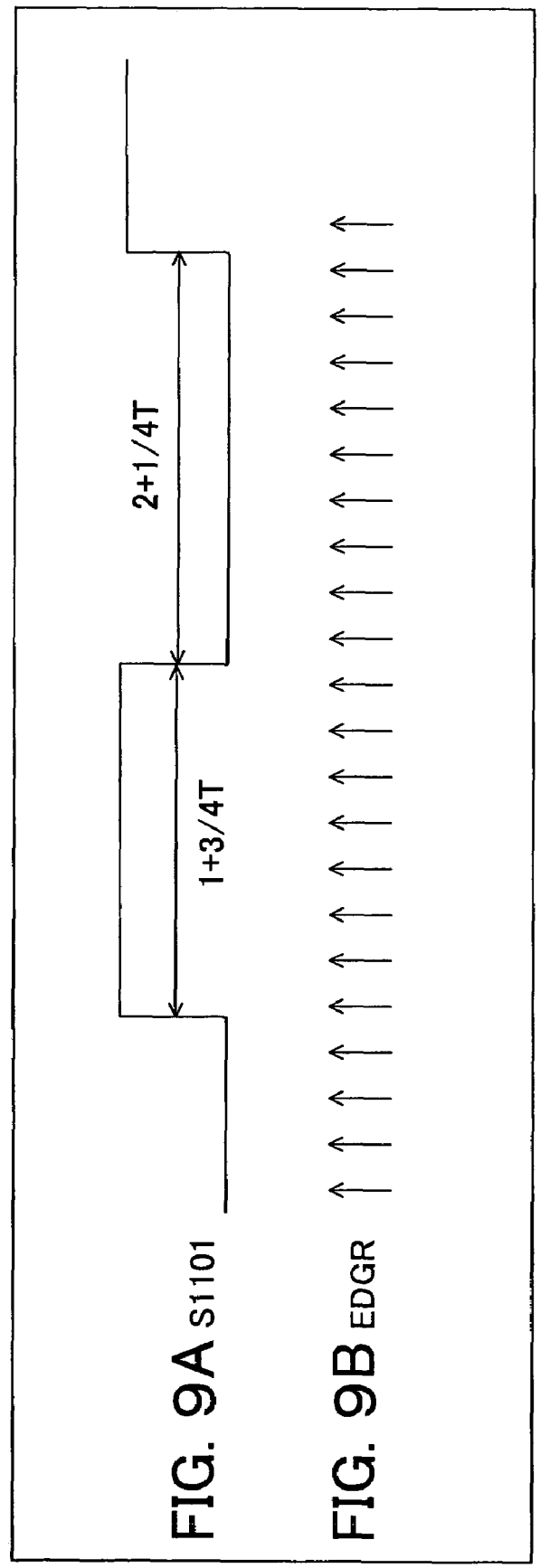
FIGS. 9A and 9B are diagrams showing the state of measurement of edge intervals in the case of using a quadrature clock in an edge interval measurement unit according to an embodiment of the present invention.

The edge interval measurement unit 1105 measures the edge interval length based on the edge position information S1102 from the edge position measurement unit 1102 and outputs the result to the propagation delay difference control amount calculation unit 1106. At this time, the binarized signal polarity is input to the propagation delay difference control amount calculation unit 1106. FIGS. 9A and 9B are diagrams showing the state of measurement of the edge interval when using quadrature clocks. FIG. 9A shows the binarized signal S1101, and FIG. 9B shows the rising edge EDGR of the multi-phase clocks CLKn.

The propagation delay difference control amount calculation unit 1106 receives as input the amount of jitter from the jitter measurement unit 1104 and the edge interval length from the edge interval measurement unit 1105 and controls the propagation delay difference by injecting the slice level voltage of the comparator 1101 through the DAC 1107. The slice level voltage is determined so that the amount of jitter error or amount of digital sum value (DSV) error, or both, become small. Here, the amount of DSV error indicates the amount of deviation from the average value of 0.5 when the H level is 1 and the L level is 0.

Figure 10:
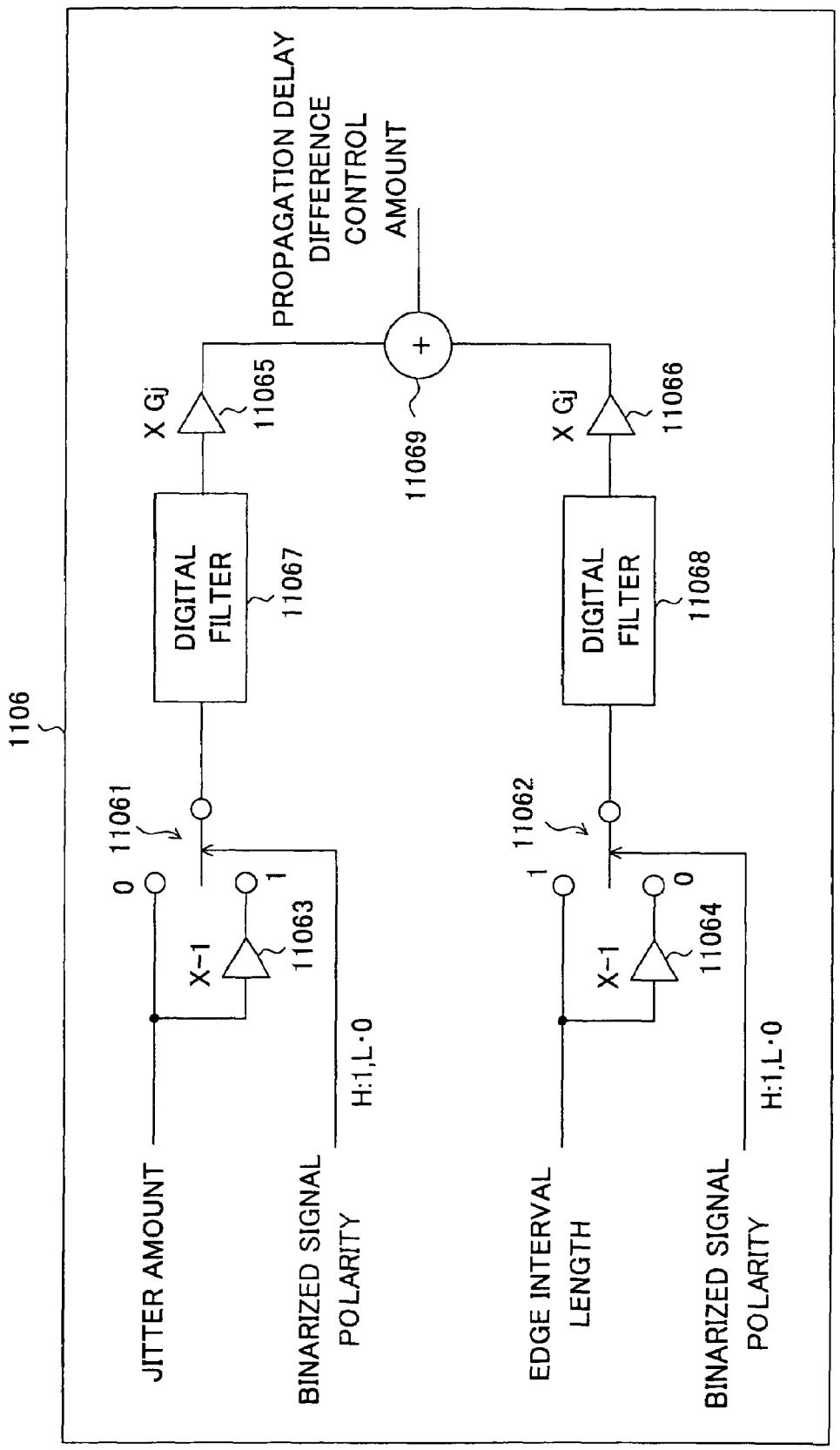
FIG. 10 is a diagram of a concrete example of the configuration of a propagation delay difference control calculation unit according to an embodiment of the present invention.

FIG. 10 is a diagram of an example of the concrete configuration of the propagation delay difference control amount calculation unit 1106 according to the present embodiment. This propagation delay difference control amount calculation unit 1106, as shown in FIG. 10, has switch circuits 11061 and 11062, amplifiers 11063 to 11066, digital filters 11067 and 11068, and an adder 11069. Note that the digital filters 11067 and 11068 are typical LPFs.

The propagation delay difference control amount calculation unit 1106 receives as input the jitter measurement value and the polarity of the binarized signal following the edge from the jitter measurement unit 1104. It performs inversion processing of the amount of jitter at the switch circuit 11061 in accordance with the polarity of the binarized signal (1 at the H level and 0 at the L level), then inputs it to the digital filter 11067. The output of the digital filter 11067 is amplified under a gain Gj at the amplifier 11065. On the other hand, the edge interval length measurement value and the polarity of the binarized signal are input from the edge interval measurement unit 1105. It performs the inversion processing of the edge interval length at the switch circuit 11062 in accordance with the polarity of the binarized signal, then inputs to the digital filter 11068. The output of the digital filter 11068 is amplified under a gain of Gj at the amplifier 11066. The amount of jitter and the edge interval length are filtered, then added at the adder 11069 and become the propagation delay difference control amount. The propagation delay difference control amount calculation unit 1106 makes the slice level large when the control amount is large and makes the slice level small when the control amount is small. Note that one of the gains Gi and Gj of the amplifiers 11065 and 11066 may be 0 too.

Figure 1:
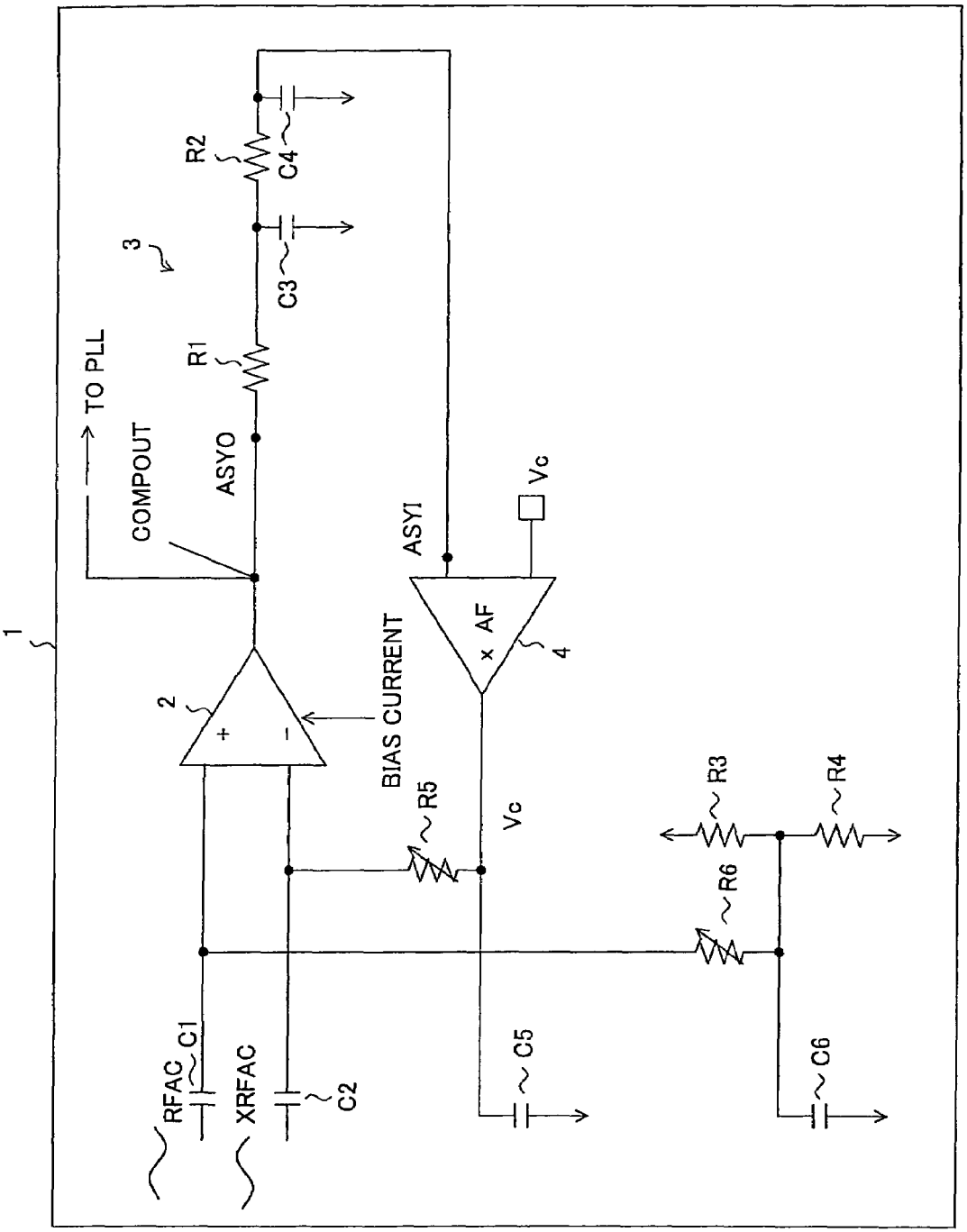
FIG. 1 is a circuit diagram of an example of the configuration of a general binarization circuit.
Figure 2:
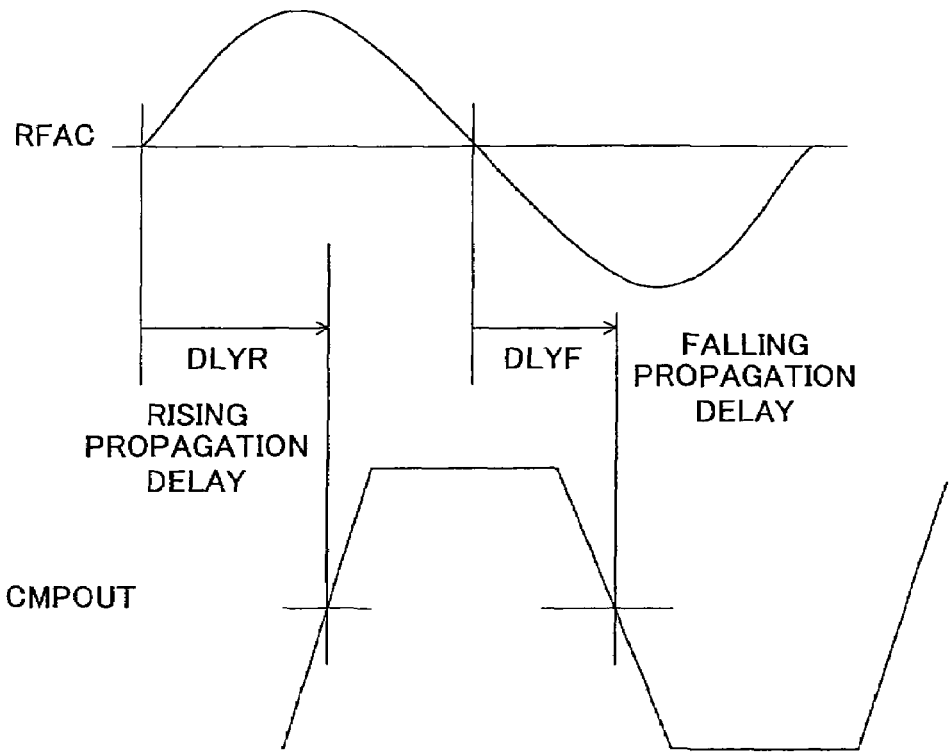
FIGS. 2A and 2B are graphs for explaining a difference propagation delay as a problem in the circuit of FIG. 1.
Figure 3:
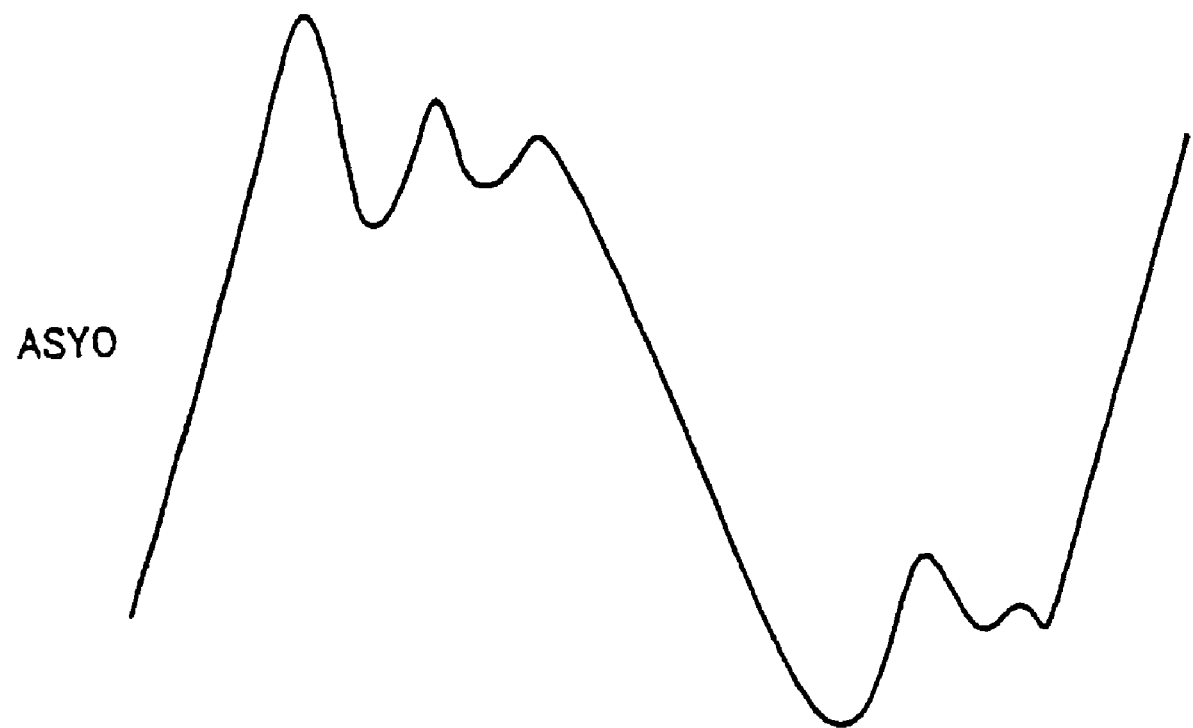
FIG. 3 is a diagram for explaining disturbance of a waveform as a factor of error in the circuit of FIG. 1.

Here, an explanation will be given of the inversion processing of the amount of jitter in the propagation delay difference control amount calculation unit 1106 with reference to FIGS. 11A to 1C. In FIGS. 11A to 11C, SLC1 indicates a first slice level, and SLC2 indicates a second slice level. Further, FIG. 11A shows the forward phase signal RFAC before the binarization, FIG. 11B shows a binarized signal S1101-1 based on the first slice level SLC1, and FIG. 11C shows a binarized signal S1101-2 based on the second slice level SLC2. Further, the upward arrows in the figure show the channel clock edges. The binarized signal S1101-1 corresponding to the first slice level SLC1 has jitter.

From FIGS. 11A to 11C, it can be read that the slice level must be made smaller for positive jitter at the rising edge and must be made smaller for negative jitter at the falling edge. For this reason, when the RF binarized signal following the edge is H, since the edge is a rising edge, the amount of jitter is inverted.

Next, an explanation will be given of the inversion processing of the edge interval length in the propagation delay difference control amount calculation unit 1106 with reference to FIGS. 12A to 12C. In FIGS. 12A to 12C, SLC1 shows the first slice level, and SLC2 shows the second slice level. Further, FIG. 12A shows the forward phase signal RFAC before the binarization, FIG. 12B shows the binarized signal S1101-1 based on the first slice level SLC1, and FIG. 12C shows the binarized signal S1101-2 based on the second slice level SLC2.

As seen from FIGS. 12A to 12C, in the binarized signal S1101-1 corresponding to the first slice level SLC1, an H section and an L section are unbalanced. In order to eliminate this unbalance, it is necessary to make the slice level large when the H section is long and make the slice level small when the L section is long. For this reason, the edge interval of the H section is made a positive value, and the edge interval of the L section is made a negative value.

By employing the binarization circuit 110 explained above, due to the following advantages, the reproduction state is improved, production becomes easier, and the cost becomes lower. Namely, the signal input to the channel data discrimination unit 1103 and the signal used for calculating the propagation delay error control amount have the same precision, so making the measured amount of propagation error zero leads to the best channel data discrimination precision and enables high precision control. Further, even if there is temperature fluctuation, voltage fluctuation, aging, etc. of the analog circuit components, they can be corrected while reproducing the signal. Also, variations in production of the analog circuit components can be corrected. Further, control is by digital processing without using the waveform information of the signal, so there are few error factors. Still further, the number of the components realized by analog circuits is small.

Note that the edge position measurement unit 1102 does not have to use the multi-phase clocks as explained above and may measure the edge position by using a clock having a sufficiently higher frequency than the channel clock. Further, the VCO may be synchronized with the channel clock or not synchronized. The point is that the edge position can be measured with sufficiently high precision.

Figure 13:
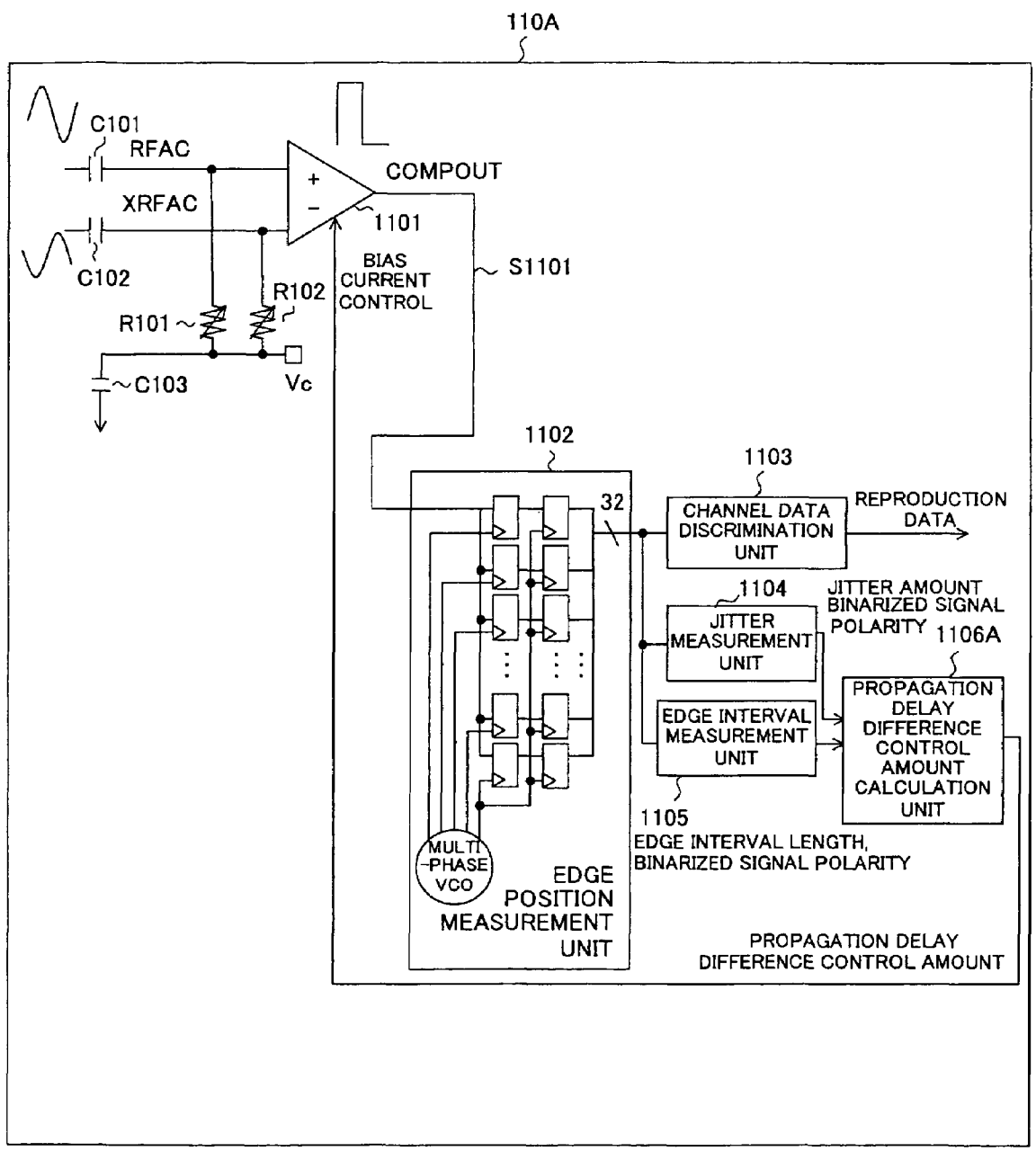
FIG. 13 is a diagram of another example of the configuration of the propagation delay difference control amount calculation unit according to an embodiment of the present invention.

Further, a propagation delay difference control amount calculation unit 1106A may control the difference in propagation delay by controlling the drive capability of the binarized signal as shown in for example FIG. 13. Namely, when there is a difference in propagation delay in the comparator 1101, it utilizes the fact that the sharper the rising characteristic/falling characteristic thereof (the higher the drive capability), the smaller the difference in propagation delay and the blunter the rising characteristic/falling characteristic thereof (the smaller the drive capability), the larger the difference in propagation delay.

Figure 14:
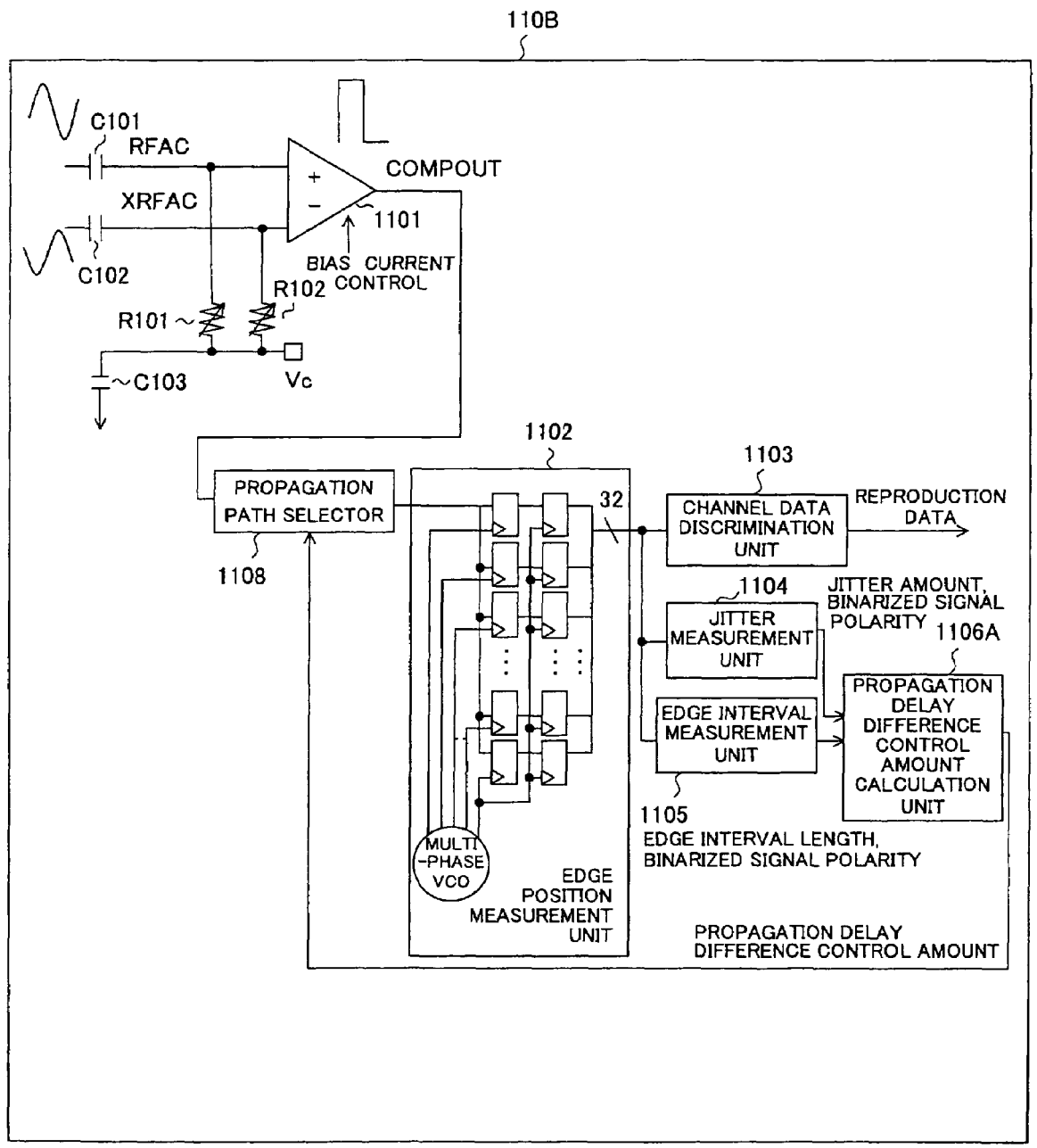
FIG. 14 is a diagram of still another example of the configuration of the propagation delay difference control amount calculation unit according to an embodiment of the present invention.
Figure 15:
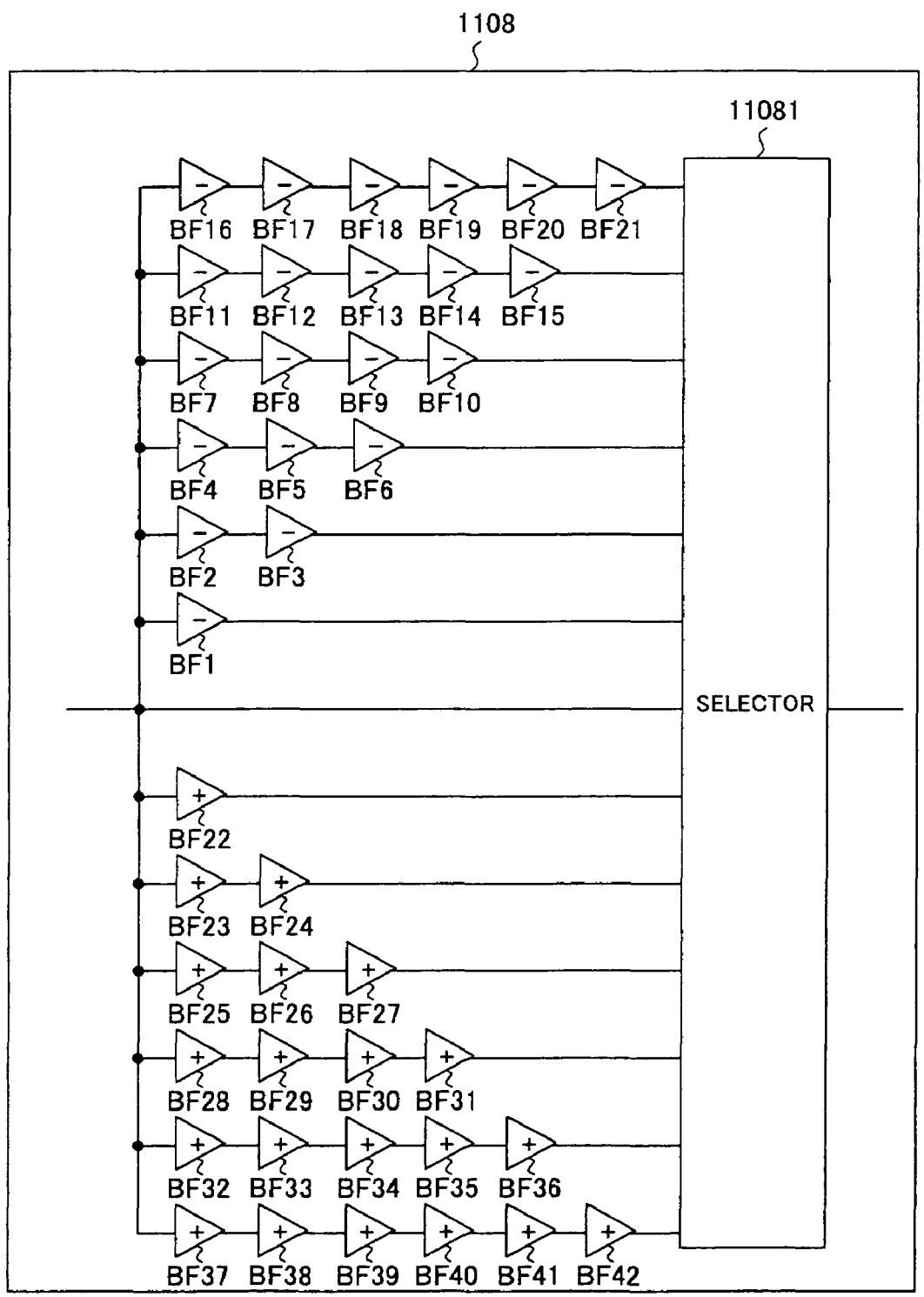
FIG. 15 is a diagram of an example of the configuration of a propagation path delay unit of FIG. 14.

Further, for example as shown in FIG. 14, a propagation delay difference control amount calculation unit 1106A can control the difference in propagation delay by changing the propagation path of the binarized signal by a propagation path selector 1108. The propagation path selector 1108 is realized by for example buffers BF1 to BF42 and a selector 11081 as in FIG. 15. The buffers BF22 to BF42 with the + marks have larger amounts of delay of the falling edge than amounts of delay of the rising edge, and the buffers BF1 to BF21 with the − marks have smaller amounts of delay of the falling edge than the amounts of delay of the rising edge. Due to this configuration, the amount of propagation delay can be controlled.

Figure 16:
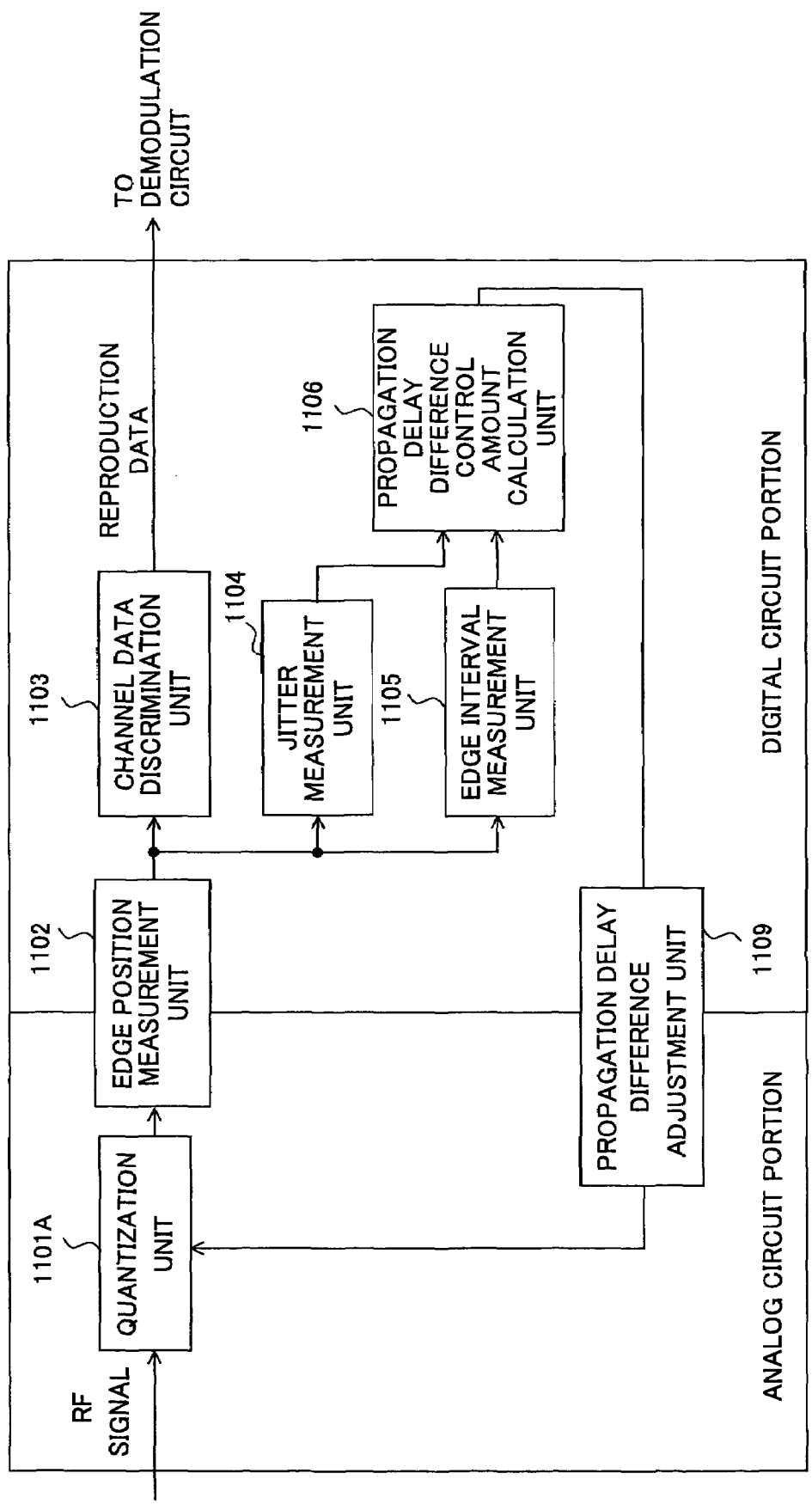
FIG. 16 is a diagram of the general configuration of a binarization circuit according to an embodiment of the present invention.

Further, FIG. 16 is a view of the configuration showing the general form of the binarization circuit 110 according to the present embodiment. The binarization circuit 110 essentially has the following configuration.

1) It has a quantization unit 1101A equipped with a propagation delay difference control function;

2) The processing is carried out in a digital manner after measuring the edge position of the quantization signal; and 3) In the digital processing after the edge position measurement, the jitter measurement unit 1104, the edge interval measurement unit 1105, and the channel data discrimination unit 1103 have the same analog/digital interface.

Note that, in FIG. 16, the propagation delay difference adjustment unit 1109 corresponds to the DAC 1107 in the configuration of FIG. 7, corresponds to the adjustment of the drive capability of the comparator 1101 configuring the quantization unit 1101A in the configuration of FIG. 13, and corresponds to the configuration including the comparator 1101 and the propagation path delay unit 1108 in the configuration of FIG. 14.

The clock reproduction circuit 111 includes a PLL circuit, extracts the clock based on the RF signal binarized at the binarization circuit 110, and outputs the RF signal as a digital signal to the decoder/encoder circuit 115. This clock reproduction circuit 111 includes for example the channel data discrimination unit 1103 of FIG. 7, FIG. 13, and FIG. 14.

In this way, after the RF signal is binarized, the clock is extracted. The signal after the end of the binarization and the clock extraction becomes a digital signal which is supplied to the decoder/encoder circuit 115 and subjected to EFM+ demodulation. In this case, the decoder/encoder circuit 115 for performing the pipeline processing is supplied with a series of data having a magnitude required at each pipeline stage in units of blocks (BLK). For example, a plurality of blocks (for example BLK1 to BLK3) are continuously supplied.

The physical address reading circuit 112 supplies a physical address to be recorded in accordance with the signal supplied from the RF amplifier 106 to the write pulse generation circuit 114 at the time of recording data. The clock generation circuit 113 extracts a clock based on the data encoded at the decoder/encoder circuit 115 and subjected to the EFM+ modulation at the time of recording data and outputs it to the write pulse generation circuit 114. The write pulse generation circuit 114 generates a desired write pulse based on the clock from the clock generation circuit 113 and the physical address from the physical address reading circuit 112 and outputs it to the laser driver 109. The laser driver circuit 109 drives the laser diode of the optical pick-up 103 in accordance with this write pulse and records the desired data at the desired position of the desired track of the disc 101.

The decoder/encoder circuit 115 is continuously supplied with one or more of a series of continuous block units (hereinafter, referred to as "block data") and performs the decoder pipeline processing and the encoder pipeline processing using a plurality of memories able to switch connections and the tracking buffer. In the case of decoding, the decoder/encoder circuit 115 accesses a plurality of memories (for example two memories, that is, the first and second memories) in parallel in accordance with the status information ST0 or ST1, performs the decoding, stores the data after the processing in the tracking memory, then transfers the data stored in the tracking memory to the host apparatus 117 according to a request from the host apparatus 117. In the case of encoding, the decoder/encoder circuit 115 writes the user data transferred in units of blocks from the host apparatus 117 into the third memory serving as the tracking buffer, starts the encoding, accesses a plurality of memories in parallel in accordance with the status information ST0 or ST1 to perform the encoding, and outputs the result to the clock generation circuit 113.

The decoder/encoder circuit 115 basically has, as shown in FIG. 4 to FIG. 6, an EFM+ demodulator 1151, an EFM+ modulator 1152, an error corrector 1153 having a parity generation function serving as the error processing circuit and the recording data preparation circuit, a host interface circuit 1154, a memory portion 1155, and a bus portion 1156 as principal components.

The EFM+ demodulator 1151 performs the EFM+ demodulation with respect to the digital RF signal supplied as a series of data blocks by the clock reproduction circuit 111 at the time of reproducing data and writes the data after the demodulation via the bus portion 1156 into either of the plurality of memories (two memories of the first memory and the second memory as will be explained in the present embodiment) of the memory portion 1155 in accordance with the status information ST0 or ST1.

The EFM+ modulator 1152 reads out the user data (prepared data to be recorded) given the ECC parity etc. and stored in either of the plurality of memories of the memory portion 1155 in accordance with the status information ST1 or ST2, performs the EFM+ modulation with respect to the read out data, and outputs the result as a binary signal to the clock generation circuit 113.

In the present embodiment, at the time of decoding, as the status information ST0 and ST2, use is made of information changing according to the processing situation of at least one circuit between the EFM+ demodulator 1151 and the error processing circuit. Specifically, when the EFM+ demodulator 1151 writes the data after the EFM+ demodulation into the first memory or the second memory, it alternately changes to state 0 and state 1. When the state is 0, the data becomes the status information ST0, while when the state is 1 it becomes the status information ST1. At the time of encoding, as the status information ST0 and ST1, use is made of information changing according to the processing situation of at least one circuit between the EFM+ modulator 1152 and the error corrector 1153 as the recording data preparation circuit. Specifically, it alternately changes to state 0 and state 1 when the EFM+ modulator 1152 reads the data to be recorded for the EFM+ modulation from the first memory or the second memory. When the state is 0 it becomes the status information ST0, while when the state is 1 it becomes the status information ST1.

Note that the status information is not limited to information according to the processing situation of the circuit. It is also possible to configure the system so that the status information ST0 and ST1 are alternately output every predetermined time by for example a timer. Various aspects are possible. Further, two status information were used because the two memories of the first memory and the second memory were covered in this embodiment, but the number of status information may be appropriately changed in accordance with the number of the memories.

The error corrector 1153 includes an ECC circuit and an EDC circuit. At the time of reproducing data, it reads out the data after the EFM+ demodulation written in either of the plurality of memories of the memory portion 1155 via the bus portion 1156 in accordance with the status information ST0 and ST1, performs error correction processing such as EEC processing and EDC processing while accessing the plurality of memories of the memory portion 1155 in accordance with the status information ST0 and ST1, and stores the data for which the error correction has ended via the bus portion 1156 into the tracking memory of the memory portion 1155. Further, at the time of recording data, the error corrector 1153 reads out the user data from the tracking memory of the memory portion 1155 via the bus portion 1156, performs the scrambling, the EDC parity generation, the ID generation, various types of field information generation, etc., and alternately writes the scrambled user data, EDC parity, ID, and various types of field information into the plurality of memories of the memory portion 1155 in accordance with the status information ST0 and ST1 for every block unit.

At the time of reproducing data, the host interface circuit 1154 transfers the data after the decoding stored in the tracking memory of the memory portion 1155 to the host apparatus 117 according to a request from the host apparatus 117. At the time of recording data, the host interface circuit 1154 writes the user data to be encoded transferred from the host apparatus 117 in units of blocks into the tracking buffer of the memory portion 1155 via the bus portion 1156.

The memory portion 1155 includes a plurality of memories (two in the present embodiment, i.e., the first memory and the second memory) made of for example SRAMs able to store data having a capacity required at each pipeline stage as the memory and a memory serving as a buffer memory (third memory) made of for example a DRAM and performs the following processing at the time of reproducing data and the time of recording data. At the time of reproducing data, the memory portion 1155 alternately writes data in units of blocks after the EFM+ demodulation at the EFM+ demodulator 1151 supplied through the data path of the bus portion 1156 formed in accordance with the status information ST0 and ST1 into the first memory and the second memory, reads out the recording data from the first memory or the second memory not written in to the error corrector 1153 through the data path of the bus portion 1156 formed in accordance with the status information ST0 and ST1, writes the data (EDC) for the error correction into the first memory or the second memory, and stores the data after ending the error correction into the third memory (tracking memory). At the time of recording data, the memory portion 1155 writes the user data transferred from the host apparatus 117 in units of blocks (or in units of smaller sectors, 1 block=16 sectors) into the third memory (tracking memory) serving as the tracking buffer via the bus portion 1156, the error corrector 1153 reads out the user data stored in the third memory after the start of the encoding, the user data, the EDC parity, ID, and various types of field information scrambled at the error corrector 1153 are alternately written through the data path of the bus portion 1156 formed in accordance with the status information ST0 and ST1 into the first memory and the second memory for every block unit, and the EFM+ modulator 1152 reads out the data stored in the first memory or the second memory.

The bus portion 1156 has a path switching function for switching the data transfer path between the EFM+ demodulator 1151, the EFM+ modulator 1152, and the error corrector 1153 with the first memory and the second memory of the memory portion 1155 in accordance with the status information ST0 and ST1, forming the data transfer path among the error corrector 1153 and the host interface circuit 1154 and the tracking buffer of the memory portion 1155, and efficiently performing the decoding pipeline processing at the time of reproducing data and the encoding pipeline processing at the time of recording data.

Below, an explanation will be given of the more concrete configurations and functions of the error corrector 1153, the memory portion 1155, and the bus portion 1156 in the decoder/encoder circuit 115.

Figure 17:
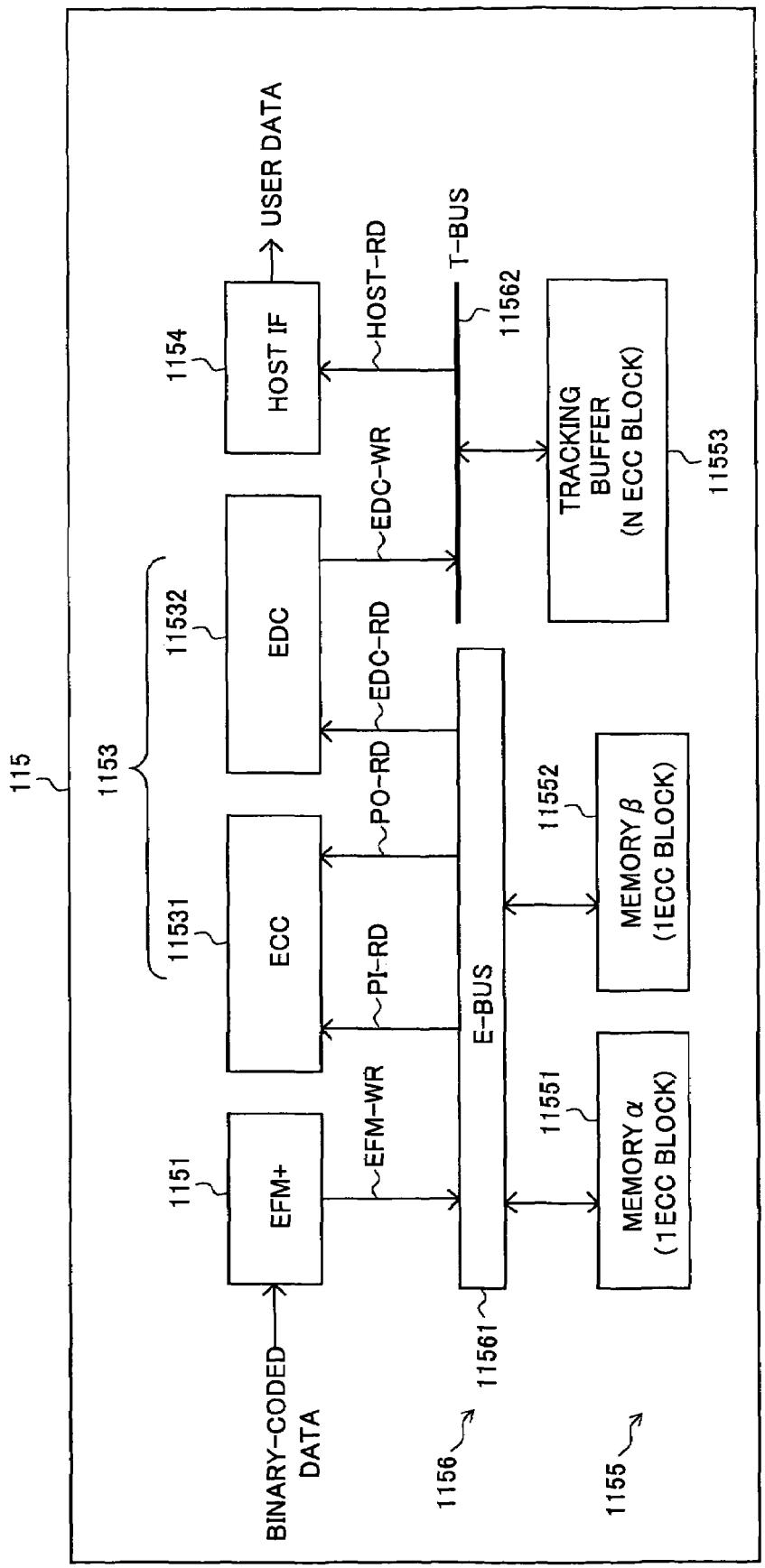
FIG. 17 is a diagram of the concrete configurations of an error corrector, a memory portion, and a bus portion in a decoder/encoder circuit according to an embodiment of the present invention in the case of decoding at the time of data reproduction and specifically showing a data path.
Figure 18:
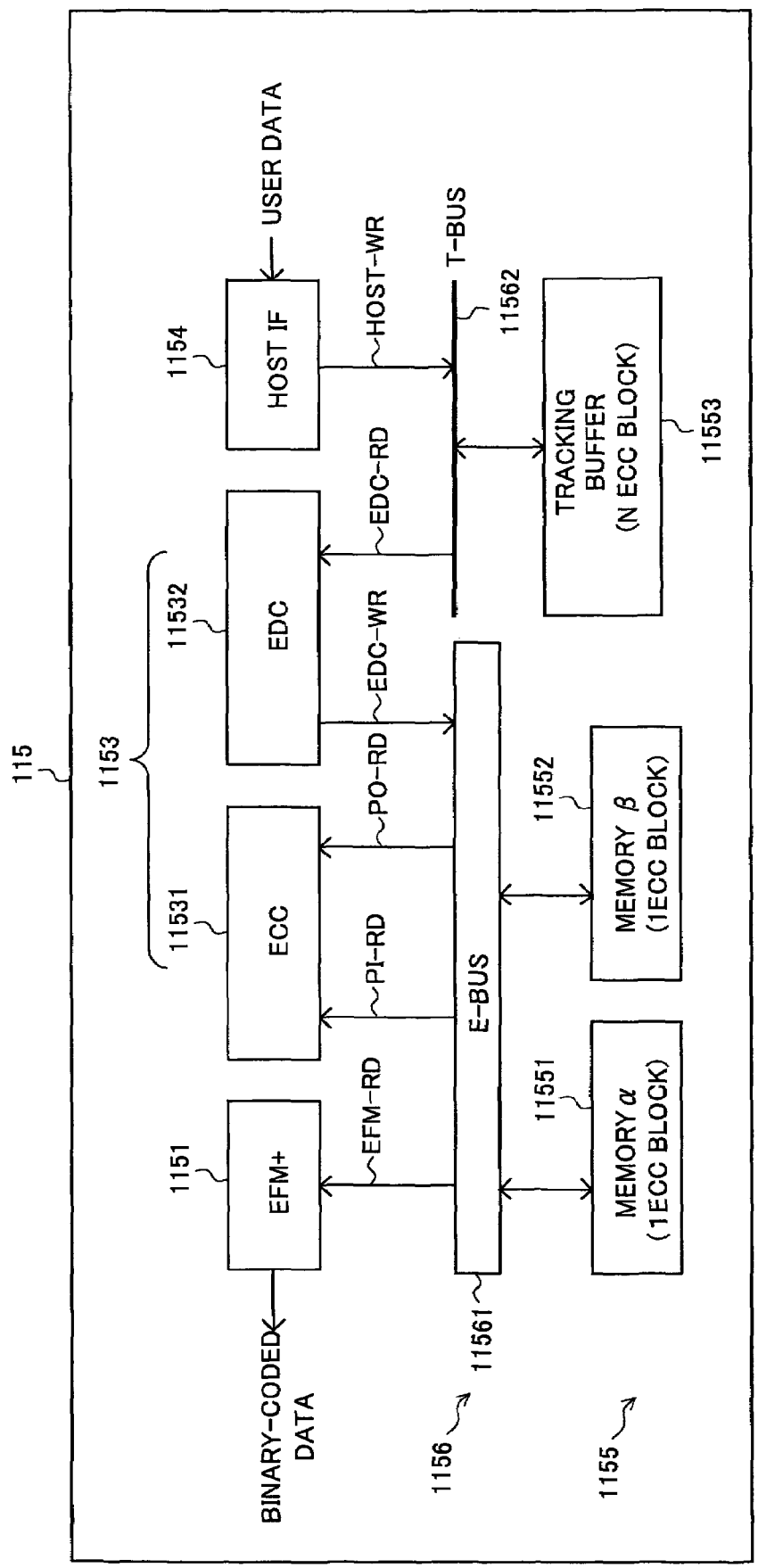
FIG. 18 is a diagram of the concrete configurations of an error corrector, a memory portion, and a bus portion in a decoder/encoder circuit according to an embodiment of the present invention in the case of encoding at the time of data recording and specifically showing a data path.

FIG. 17 is a view of the concrete configurations of the error corrector 1153, the memory portion 1155, and the bus portion 1156 in the decoder/encoder circuit 115 in the case of decoding at the time of reproducing data and specifically shows the data path. Further, FIG. 18 is a view of the concrete configurations of the error corrector 1153, the memory portion 1155, and the bus portion 1156 in the decoder/encoder circuit 115 in the case of the encoding at the time of recording data and specifically showing the data path. In these figures, WR indicates a write operation, and RD indicates a read operation.

The error corrector 1153 of FIG. 17 and FIG. 18 includes an ECC circuit 11531 and an EDC circuit 11532. The memory portion 1155 of FIG. 17 and FIG. 18 includes a first memory 11551 (sometimes also referred to as a memory α) made of for example an SRAM, a second memory 11552 (sometimes also referred to as a memory β) made of for example an SRAM, and a third memory (tracking memory) 11553 made of a DRAM. The bus portion 1156 of FIG. 17 and FIG. 18 has an EFM+ demodulator 1151, an EFM+ modulator 1152 (not shown in FIGS. 17 and 18), an ECC circuit 11531 of the error corrector 1153, a first bus (E-BUS) 11561 including a function of switching the data transfer path between the EDC circuit 11532 and the first memory 11551 and the second memory 11552 of the memory portion 1155 in accordance with the status information ST0 and ST1, and a second bus (T-BUS) 11562 for forming the data transfer path among the EDC circuit 11532 and the host interface circuit 1154 and the third memory (tracking memory) 11553 of the memory portion 1155.

Figure 19:
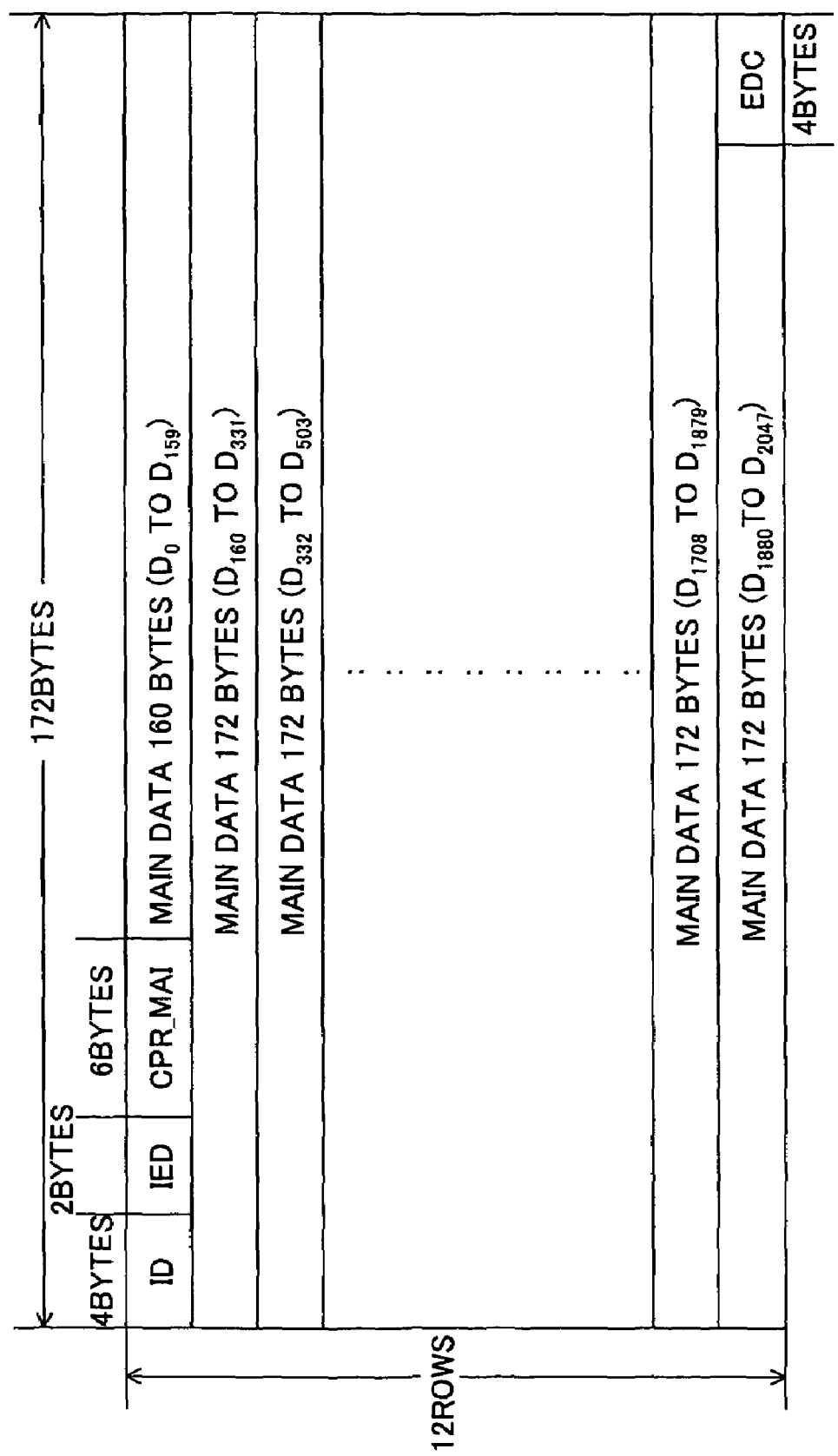
FIG. 19 is a diagram for explaining a DVD data format and shows the structure of a data frame.
Figure 20:
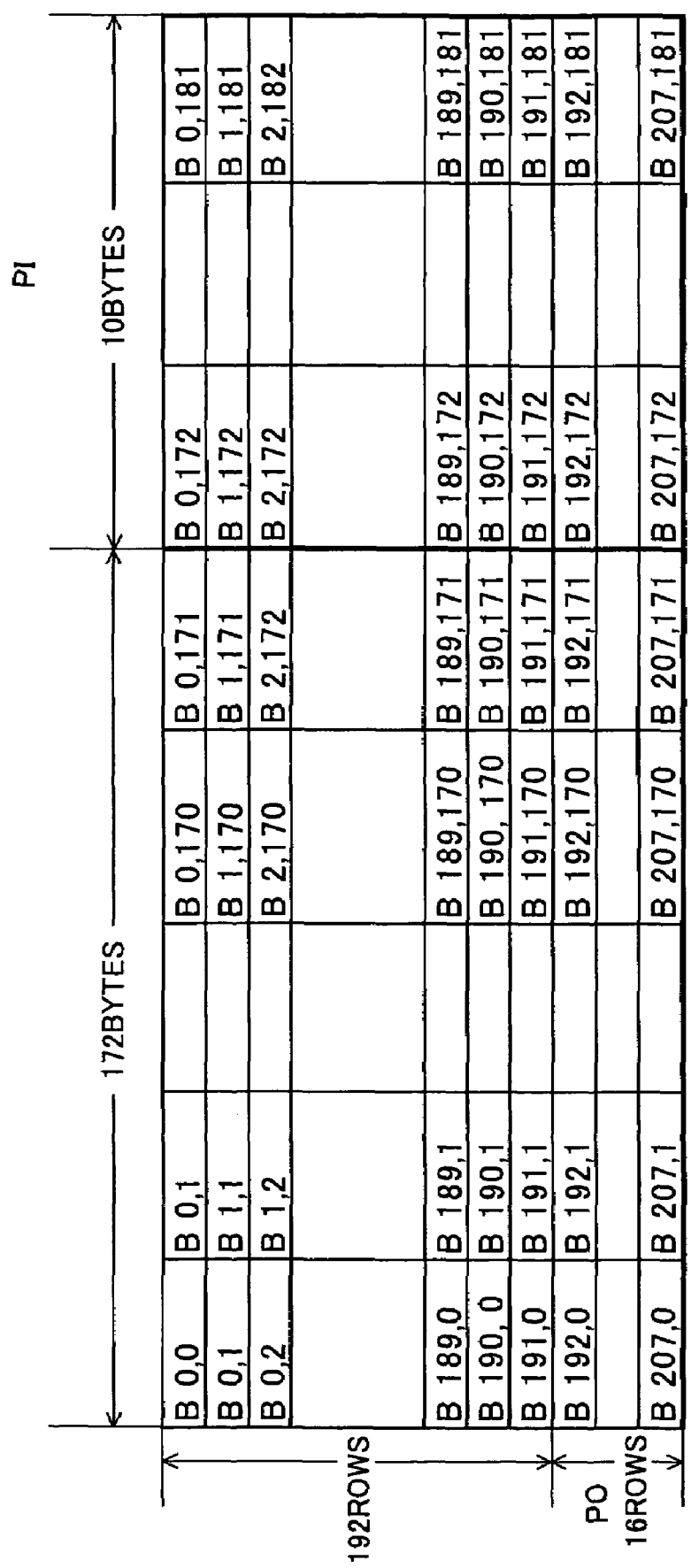
FIG. 20 is a diagram for explaining a DVD data format and shows the structure of an ECC block.

Here, for easy understanding of the following explanation, the data format of the DVD will be summarized with reference to FIG. 19 and FIG. 20.

FIG. 19 is a diagram for explaining a DVD data format showing a data frame structure. FIG. 20 is a diagram for explaining the DVD data format showing an ECC block structure.

As shown in FIG. 19, the data frame is comprised of 2064 bytes in total of main data of 2046 bytes, an ID (Identification Data) of 4 bytes arranged on the header side of the main data, an IED (ID Error Detection Code) of 2 bytes, a CPR_MAI (Copyright Management Information) of 6 bytes, and an EDC (Error Detection Code) of 4 bytes behind the main data. In a data frame having such a structure, after the EDC computation, the main data of 2048 bytes is added. This becomes the scramble frame.

An ECC block is comprised of 16 continuously scrambled frames. Namely, as shown in FIG. 20, an ECC block is formed by 16 scrambled frames as the information field. The 172 bytes×192 rows shown in FIG. 20 are equivalent to 72 bytes× 12 rows×16 scrambled frames. Each of the 172 columns is given a Reed-Solomon (RS) 16-byte outer-code parity (PO). Each of the 208 rows including the PO code is given a 10-byte inner-code parity (PI).

At the time of decoding, the ECC circuit 11531 performs the error correction processing of the block data after the EFM+ demodulation stored in the first memory 11551 and the second memory 11552 of the memory portion 1155. The memory access of the error correction processing in the ECC circuit 11531 at the time of the decoding is accompanied by the read operation of the PI code, the error correction processing in accordance with the error correction result of the PI code, the read operation of the PO code, and the error correction processing in accordance with the error correction result of the PO code. According to need, the PI correction and the PO correction are repeated. At the time of the encoding, the ECC circuit 11531 performs the ECC parity addition with respect to the data stored in the first memory 11551 or the second memory 11552 after so-called EDC processing by the EDC circuit 11532. The error correction processing is processing for reading out data having error from the memory, calculating the correct data from the detected error and read out data, and writing the correct data into the memory. The memory access of the ECC circuit 11531 at the time of encoding is accompanied by the read operation of the PI code, the parity portion rewrite processing of the PI code, the read operation of the PO code, and the parity portion rewrite processing of the PO code. Note that there are two methods for parity portion rewrite processing. The first method is the method of reading out the parity portion from the memory, calculating the correct parity, and writing the parity into a memory n. The second method is the method of directly writing the correct parity without reading out the parity portion.

The EDC circuit 11532 (refer to FIG. 17) performs the EDC check and descrambling with respect to the data after the error correction processing at the time of the decoding and writes the data after the descrambling into the tracking buffer (third memory) 11553 of the memory portion 1155.

Here, the EDC check and the descrambling are simultaneously executed. This is enabled since the data reading sequences are similar between two processings. The descrambling is to descramble the data scrambled by using a certain key information (Key) by using the key information (Key) used for scrambling. The descrambled data is not written back to the original memory, but is written into the tracking buffer (third memory) 11553 of the memory portion 1155. For this reason, in the decode processing system 11532D, the EDC data read processing (EDC-RD) from the first memory (memory α) 11551 or the second memory (memory β) 11552 of the memory portion 1155, and the EDC data write processing (EDC-WR) to the tracking buffer 11553 are simultaneously executed. The data written into the tracking buffer 11553 is the data after ending the decoding.

The EDC circuit 11532, at the time of encoding, reads out the user data from the tracking buffer 11553 of the memory portion 1155, performs the scrambling, EDC parity generation, ID generation, and various types of field information generation etc., and writes the scrambled user data, EDC parity, ID, and various types of field information into the first memory (memory α) 11551 or the second memory (memory β) 11552 of the memory portion 1155.

Here, the EDC parity generation and the scrambling are simultaneously executed. This is possible since the data reading sequences are similar between two processings. The scrambling is to scramble the data by using certain key information (Key). The scrambled data is not written back into the original memory, but is written into the first memory 11551 or the second memory 11552 of the memory portion 1155. For this reason, the EDC data read processing (EDC-RE) from the tracking buffer 11553 and the EDC data write processing (EDC-WR) into the first memory (memory α) 11551 or the second memory (memory β) 11552 of the memory portion 1155 are simultaneously executed.

The memory portion 1155, as explained above, has the first memory 11551 (memory α) made of an SRAM, the second memory 11552 (memory β) made of an SRAM, and the third memory (tracking memory) 11553 made of a DRAM. The capacities are set for example as follows. The first memory 11551 and the second memory 11552 are set to capacities so that the data having a magnitude required at each pipeline stage can be stored, concretely capacities such that at least 1 ECC block's worth of data can be stored. The third memory (tracking memory) 11553 is set to a capacity N times the ECC block. Note that the tracking buffer 11553 configures a ring buffer and achieves a role of a buffer with respect to fluctuations in the frequency of transfer requests from the host apparatus 117. Alternatively, it becomes a certain type of cache memory accompanied with pre-read processing.

Note that, in the present embodiment, when storing the data in the first memory 11551 and the second memory 11552, it is also possible to configure the system so as to encode and store the data with a predetermined key and, when reading the data, decode the data by using the key at the time of the encrypting.

The bus portion 1156 has the function of switching the data transfer path between the EFM+ demodulator 1151, the EFM+ modulator 1152, and the error corrector 1153 with respect to the first memory and the second memory of the memory portion 1155 in accordance with the status information ST0 and ST1 as mentioned above.

Figure 21:
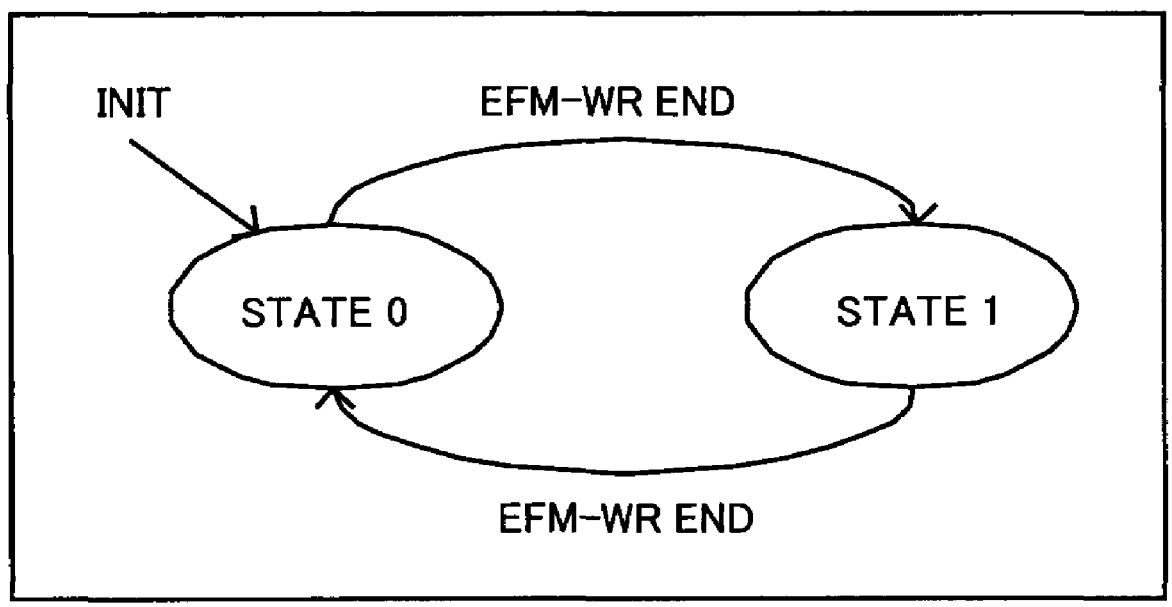
FIG. 21 is a diagram for explaining a state of alternate switching between a state 0 and a state 1 at the time of decoding.

At the time of decoding, as shown in FIG. 21, the initial state becomes the state 0. When the demodulation data write processing (EFM-WR) in the state 0 ends, the state becomes the state 1. Then, when the demodulation data write processing (EFM-WR) in the state 1 ends, the state becomes the state 0. In this way, for every end of the EFM demodulation data write processing (EFM-WR), the state 0 and the state 1 are successively switched.

Figure 22:
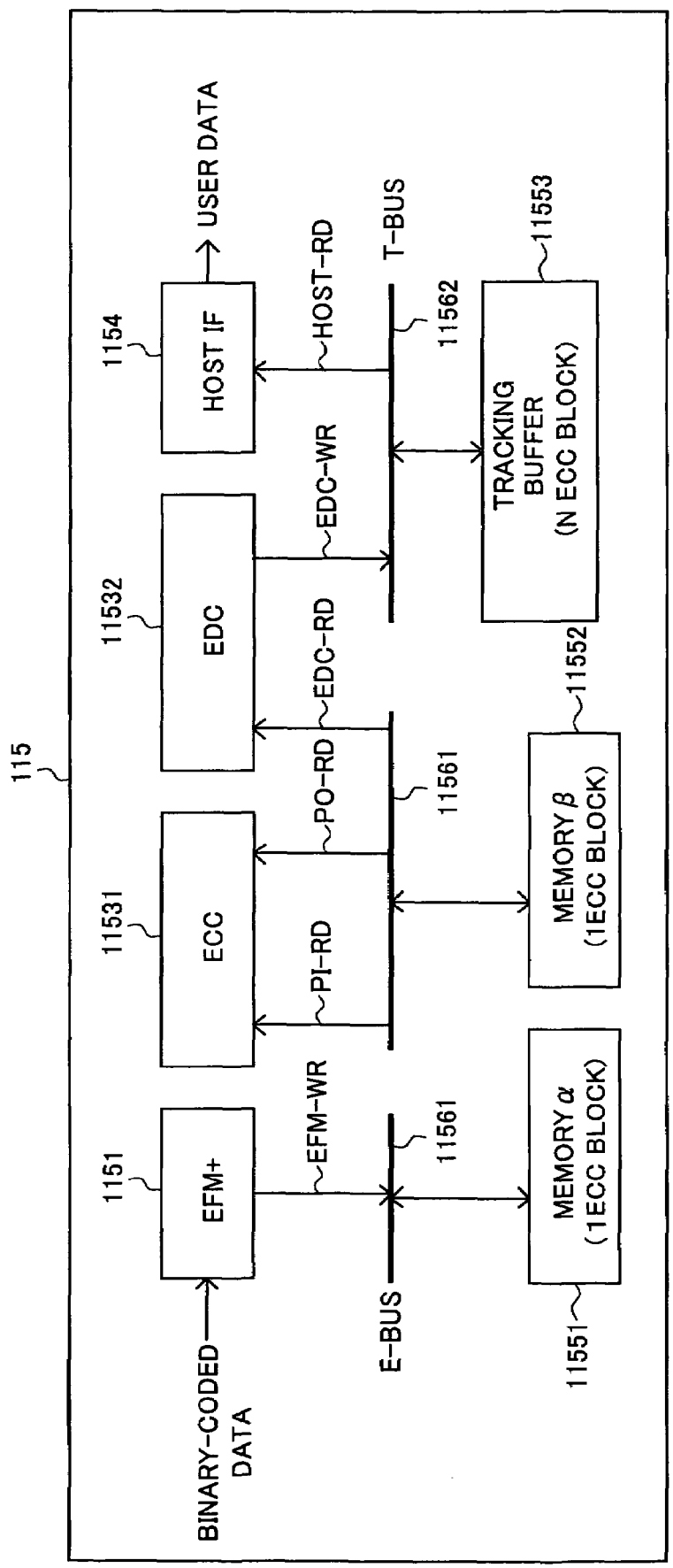
FIG. 22 is a diagram of a connection configuration of first to third memories of a memory portion and a pipeline processing circuit constituted by an EFM demodulator, an ECC circuit, an EDC circuit, and a host interface circuit by a bus portion when the status information ST0 is actively supplied at the time of decoding.

FIG. 22 is a diagram of the state of connection of the first to third memories of the memory portion and the pipeline processing circuit constituted by the EFM+ demodulator 1151, the ECC circuit 11531, the EDC circuit 11532, and the host interface circuit 1154 by the bus portion when the status information ST0 is actively supplied at the time of decoding. Further, FIG. 23 is a diagram of the state of connection of the first to third memories of the memory portion and the pipeline processing circuit constituted by the EFM+ demodulator 1151, the ECC circuit 11531, the EDC circuit 11532, and the host interface circuit 1154 by the bus portion when the status information ST1 is actively supplied at the time of decoding.

At the time of the state 0, as shown in FIG. 22, the first bus 11561 of the bus portion 1156 forms the data transfer path of the EFM+ demodulation data to be written into the first memory (memory α) from the EFM+ demodulator 1151 and forms the transfer paths of the data of the read processing of the PI code (PI-RD), the read processing of the PO code (PO-RD), and the EDC data read processing (EDC-RD) between the ECC circuit 11531 and the EDC circuit 11532 and the second memory (memory β) 11552. Further, it forms the transfer paths of the read/write processing for the PI error correction and the read/write processing for the PO error correction. Further, at the time of the state 0, as shown in FIG. 22, the second bus 11562 of the bus portion 1156 forms the data transfer path of the EDC data write processing (EDC-WR: actually the write processing of the scrambled data) from the EDC circuit 11532 to the third memory (tracking buffer) 11553 and the data transfer path from the third memory (tracking buffer) 11553 to the host interface circuit 1154.

Figure 23:
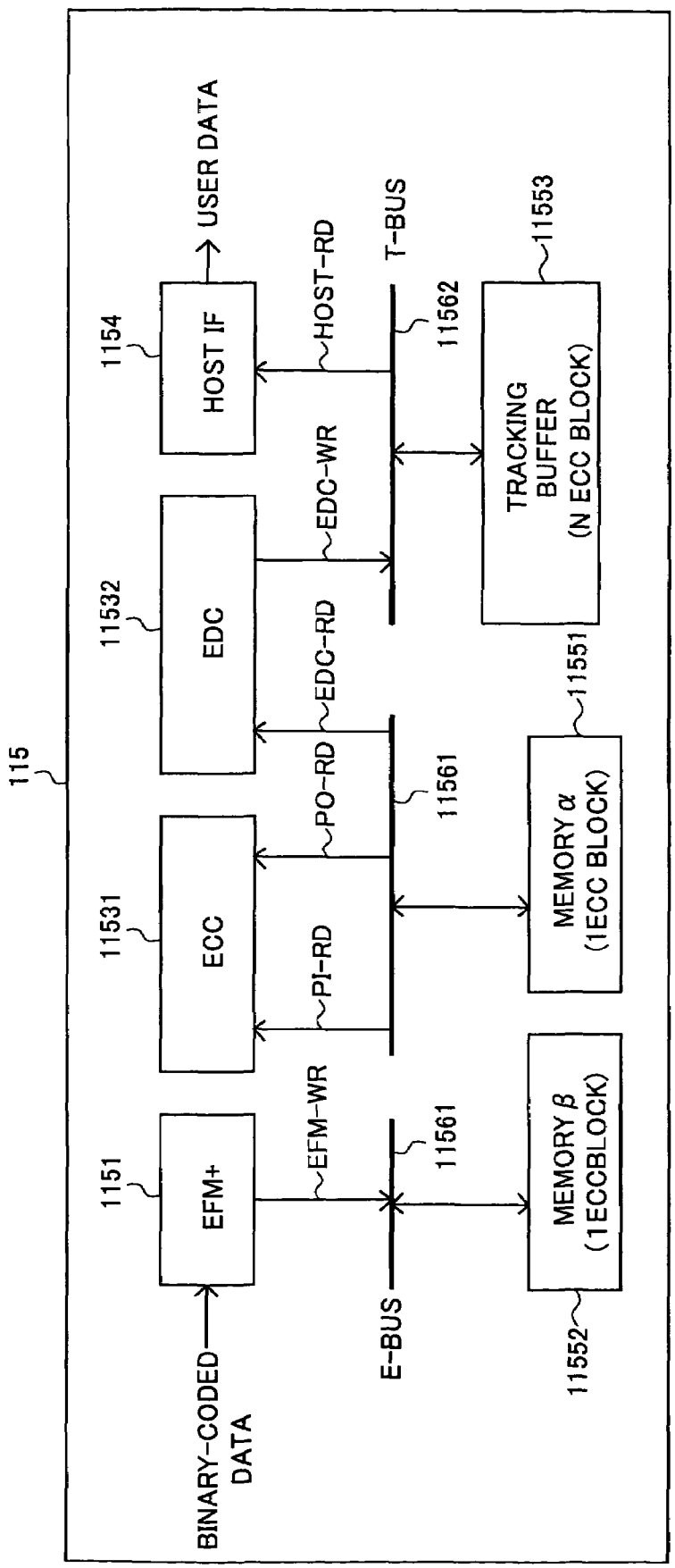
FIG. 23 is a diagram of a connection configuration of first to third memories of a memory portion and a pipeline processing circuit constituted by an EFM demodulator, an ECC circuit, an EDC circuit, and a host interface circuit by a bus portion when the status information ST1 is actively supplied at the time of decoding.

At the time of the state 1, as shown in FIG. 23, the first bus 11561 of the bus portion 1156 forms the data transfer path of the EFM+ demodulation data to be written from the EFM+ demodulator 1151 to the second memory (memory β) 11552, and forms the transfer paths of the data of the read processing of the PI code (PI-RD), the read processing of the PO code (PO-RD), and the read processing of the EDC data (EDC-RD) between the ECC circuit 11531 and EDC circuit 11532 and the first memory (memory α) 11551. Further, it forms the transfer paths of the read/write processing for the PI error correction and the read/write processing for the PO error correction. Further, at the time of state 1, as shown in FIG. 23, in the same way as the time of state 0, the second bus 11562 of the bus portion 1156 forms the data transfer path of the EDC data write processing (EDC-WR: actually the write processing of the scrambled data) from the EDC circuit 11532 to the third memory (tracking buffer) 11553 and the data transfer path from the third memory (tracking buffer) 11553 to the host interface circuit 1154.

Figure 24:
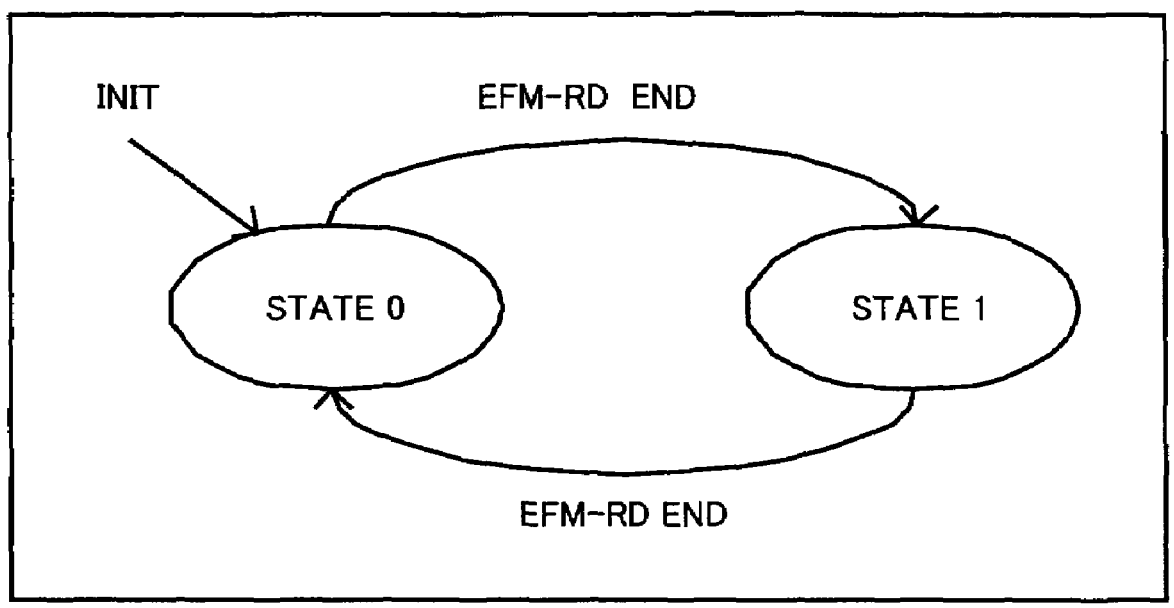
FIG. 24 is a diagram for explaining a state of alternate switching between the state 0 and the state 1 at the time of encoding.

At the time of encoding as well, as shown in FIG. 24, the initial state becomes the state 0. When the data read processing before EFM+ modulation (EFM-RD) in the state 1 is ended, the state becomes the state 1. Then, when the data read processing before the EFM+ modulation (EFM-RD) in the state 1 is ended, the state becomes the state 0. In this way, for every end of the data read processing before the EFM+ modulation (EFM-RD), the state 0 and the state 1 are successively switched.

Figure 25:
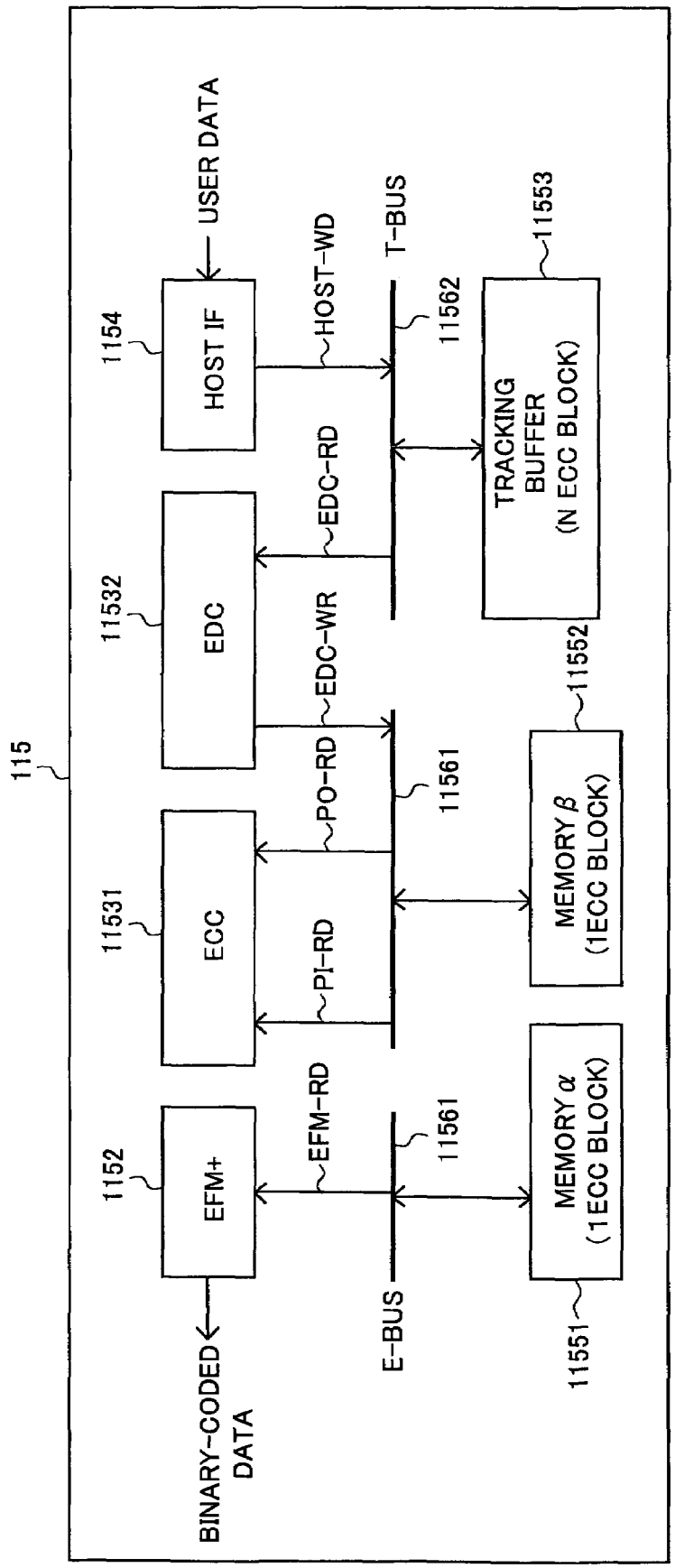
FIG. 25 is a diagram of a connection configuration of first to third memories of a memory portion and a pipeline processing circuit constituted by an EFM demodulator, an ECC circuit, an EDC circuit, and a host interface circuit by a bus portion when the status information ST0 is actively supplied at the time of encoding.

FIG. 25 is a diagram of the state of connection of the first to third memories of the memory portion and the pipeline processing circuit constituted by the EFM+ modulator 1152, the ECC circuit 11531, the EDC circuit 11532, and the host interface circuit 1154 by the bus portion when the status information ST0 is actively supplied at the time of encoding. Further, FIG. 26 is a diagram of the state of connection of the first to third memories of the memory portion and the pipeline processing circuit constituted by the EFM+ modulator 1152, the ECC circuit 11531, the EDC circuit 11532, and the host interface circuit 1154 by the bus portion when the status information ST1 is actively supplied at the time of encoding.

At the time of the state 0, as shown in FIG. 25, the first bus 11561 of the bus portion 1156 forms the transfer path of the data to be read from the first memory (memory α) 11551 in the EFM+ modulator 1152 and forms the transfer paths of the data of the read processing of the PI code (PI-RD), the read processing of the PO code (PO-RD), and the EDC data write processing (EDC-WR) between the ECC circuit 11531 and EDC circuit 11532 and the second memory (memory β) 11552. Further, at the time of the state 0, as shown in FIG. 25, the second bus 11562 of the bus portion 1156 forms the data transfer path of the EDC data read processing (EDC-RD) from the third memory (tracking buffer) 11553 in the EDC circuit 11532 and the data transfer path from the host interface circuit 1154 to the third memory (tracking buffer) 11553.

Figure 26:
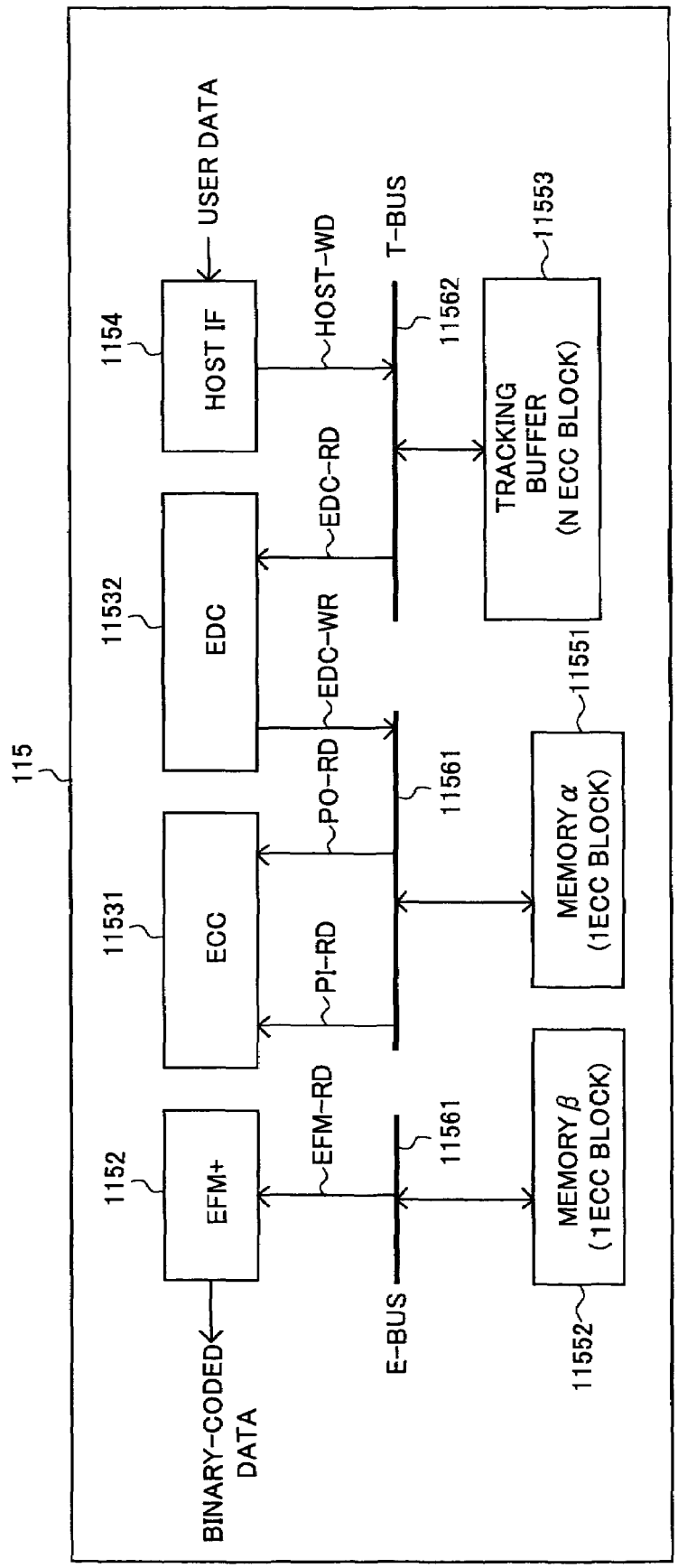
FIG. 26 is a diagram of a connection configuration of first to third memories of a memory portion and a pipeline processing circuit constituted by an EFM demodulator, an ECC circuit, an EDC circuit, and a host interface circuit by a bus portion when the status information ST1 is actively supplied at the time of encoding.

At the time of the state 1, as shown in FIG. 26, the first bus 11561 of the bus portion 1156 forms the transfer path of the data to be read from the second memory (memory β) 11552 to the EFM+ modulator 1152 and forms the transfer paths of the data of the read processing of the PI code (PI-RD), the read processing of the PO code (PO-RD), and the EDC data write processing (EDC-WR) between the ECC circuit 11531 and EDC circuit 11532 and the first memory (memory a) 11551. Further, at the time of the state 1, as shown in FIG. 26, the second bus 11562 of the bus portion 1156 forms the data transfer path of the EDC data read processing (EDC-RD) from the third memory (tracking buffer) 11553 to the EDC circuit 11532 and the data transfer path from the host interface circuit 1154 to the third memory (tracking buffer) 11553.

Below, an explanation will be given of the operation of the optical disc recording/reproducing apparatus 100 having the above configuration (refer to FIG. 4) with reference to the drawings with the binarization circuit 110 at the time of reproducing the data, the decoder pipeline processing of the decoder/encoder circuit 115, and the encoder pipeline processing at the time of recording the data as the center.

First, an explanation will be given of the data reproduction operation. The decoder pipeline processing will be explained in relation to FIG. 27.

The data read out from the disc 101 by the optical pick-up 103 and converted to the electric signal is input to the RF amplifier 106. The RF amplifier 106 performs processing with respect to a plurality of signals transferred from the optical pick-up 103, generates the tracking error signal TE and the focus error signal FE and outputs the same to the servo DSP 107, shapes the waveform with respect to the data string signal (RF signal) S106, and outputs the same to the binarization circuit 110. The servo DSP 107 performs the control of the focus servo, tracking servo, and sled servo by using the tracking error signal TE and the focus error signal FE generated at the RF amplifier 106.

The binarization circuit 110 receives the differential RF signal S106 by the RF amplifier 106, cuts the DC components by the coupling capacitors C101 and C102, and inputs the same as the forward phase signal RFAC and the inverse phase signal XRFAC to the comparator 1101. The comparator 1101 converts the forward phase signal RFAC and the inverse phase signal XRFAC to the binarized signal S1101 and outputs the same to the edge position measurement unit 1102. The edge position measurement unit 1102 measures the edge position in the time axis of the binarized signal S1101 supplied from the comparator 1101 by the multi-phase clocks by the multi-phase VCO 11021 and outputs the measurement result as the edge position information S1102 to the channel data discrimination unit 1103, the jitter measurement unit 1104, and the edge interval measurement unit 1105.

The channel data discrimination unit 1103 reproduces the data corresponding to the channel clock based on the edge position information S1102 by the edge position measurement unit 1102. The jitter measurement unit 1104 measures the amount of jitter based on the edge position information S1102 by the edge position measurement unit 1102 and outputs the result to the propagation delay difference control amount calculation unit 1106. At this time, the propagation delay difference control amount calculation unit 1106 receives as input the binarized signal polarity. The edge interval measurement unit 1105 measures the edge interval length based on the edge position information S1102 from the edge position measurement unit 1102 and outputs the result to the propagation delay difference control amount calculation unit 1106. At this time, the propagation delay difference control amount calculation unit 1106 receives as input the binarized signal polarity. Then, the propagation delay difference control amount calculation unit 1106 calculates the control amount for controlling the propagation delay difference between the input and output of the comparator 1101 based on the amount of jitter from the jitter measurement unit 1104 and the edge interval length from the edge interval measurement unit 1105 and performs control by injecting the slice level voltage of the comparator 1101 through the DAC 1107 based on this control amount.

In this way, the binarization circuit 110 binarizes the RF signal S106 from the RF amplifier 106, while the clock reproduction circuit 111 extracts the clock based on the RF signal binarized at the binarization circuit 110 and inputs the RF signal as a digital signal to the decoder/encoder circuit 115. In this case, the decoder/encoder circuit 115 for performing the pipeline processing is continuously supplied with a series of data having the magnitude required at each pipeline stage in units of blocks (BLK), for example. a plurality of blocks (for example BLK1 to BLK3).

At this time, since it is the initial state, the bus portion 1156 of the decoder/encoder circuit 115 is supplied with the status information ST0 as active, so the bus portion 1156 is in the state 0 status. Accordingly, the connection path of the decoder/encoder circuit 115 is formed as shown in FIG. 22.

Figure 27:
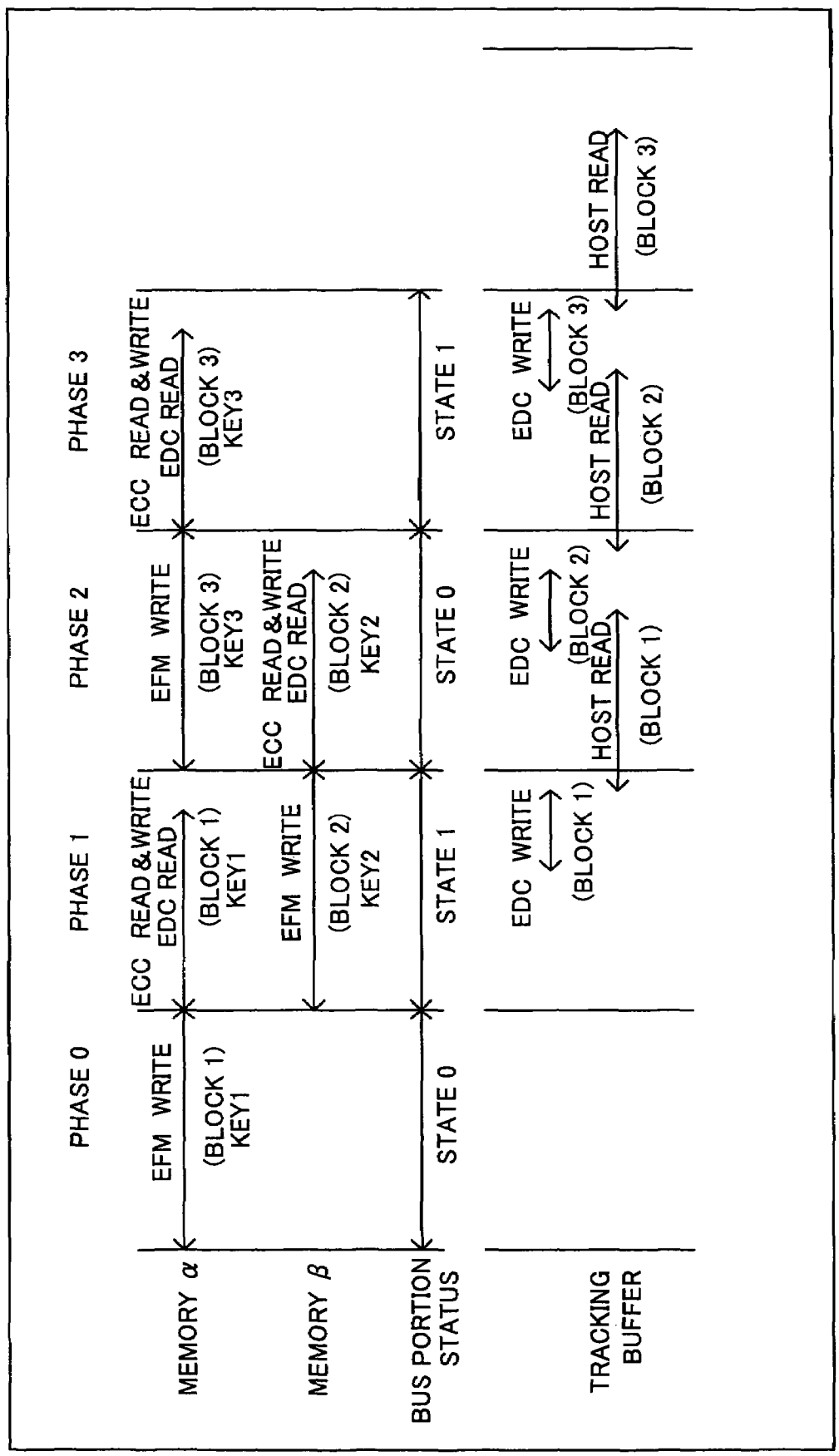
FIG. 27 is a diagram for explaining decoder pipeline processing.

Then, as shown in FIG. 27, with the phase 0, when the RF data (BLK1) binarized by the binarization circuit 110 is input to the EFM+ demodulation circuit 1151, it is subjected to EFM+ demodulation and written into the a (first memory). When the write operation of the EFM+ demodulation data is ended, the state changes to the state 1, and the connection path of the decoder/encoder circuit 115 is formed as shown in FIG. 23.

At phase 1, the EFM+ demodulation data is written into the memory β (second memory). On the other hand, after the error correction processing on the data stored in the memory α, the EDC check and the descrambling are carried out. The memory access of the error correction processing is accompanied by the read operation of the PI code, the error correction processing in accordance with the error correction result of the PI code, the read operation of the PO code, and the error correction processing in accordance with the error correction result of the PO code. According to need, the PI correction and the PO correction are repeated. The EDC, the check, and the descramble processsing are simultaneously executed. This is possible since the read sequences are similar between the two processings. The descrambled data is not written back to the original memory, but is written into the tracking buffer (third memory) 11553. For this reason, the EDC data read processing from the memory α, and the EDC data write processing to the tracking buffer are simultaneously executed. The data written into the tracking buffer is the data after the end of the decoding. Then, according to a transfer request from the host apparatus 117, the data is transferred through the host interface circuit 1154 to the host apparatus 117. As explained above, the tracking buffer 11553 configures a ring buffer and functions as a buffer unit with respect to fluctuations in the frequency of transfer requests from the host. Alternatively, it becomes a certain type of cache memory along with the previous read processing.

The data read operation for the EDC check ends before the end of the write operation of one ECC block's worth of the EFM+ data. When the write operation of one ECC block's worth of the EFM+ data is ended, the status of the bus portion 1156 changes to the state 0 again.

Accordingly, the connection path of the decoder/encoder circuit 115 is formed as shown in FIG. 22.

At phase 2, a write operation of the EFM+ demodulation data is carried out at the memory α, and the ECC decoding, the EDC check, the descrambling, etc. are carried out at the memory β.

At phase 3, the write operation of the required EFM data has already ended, so the write operation of the EFM+ demodulation data is not carried out, but the ECC decoding, the EDC check, the descrambling, etc. with respect to the memory α are carried out.

Figure 28:
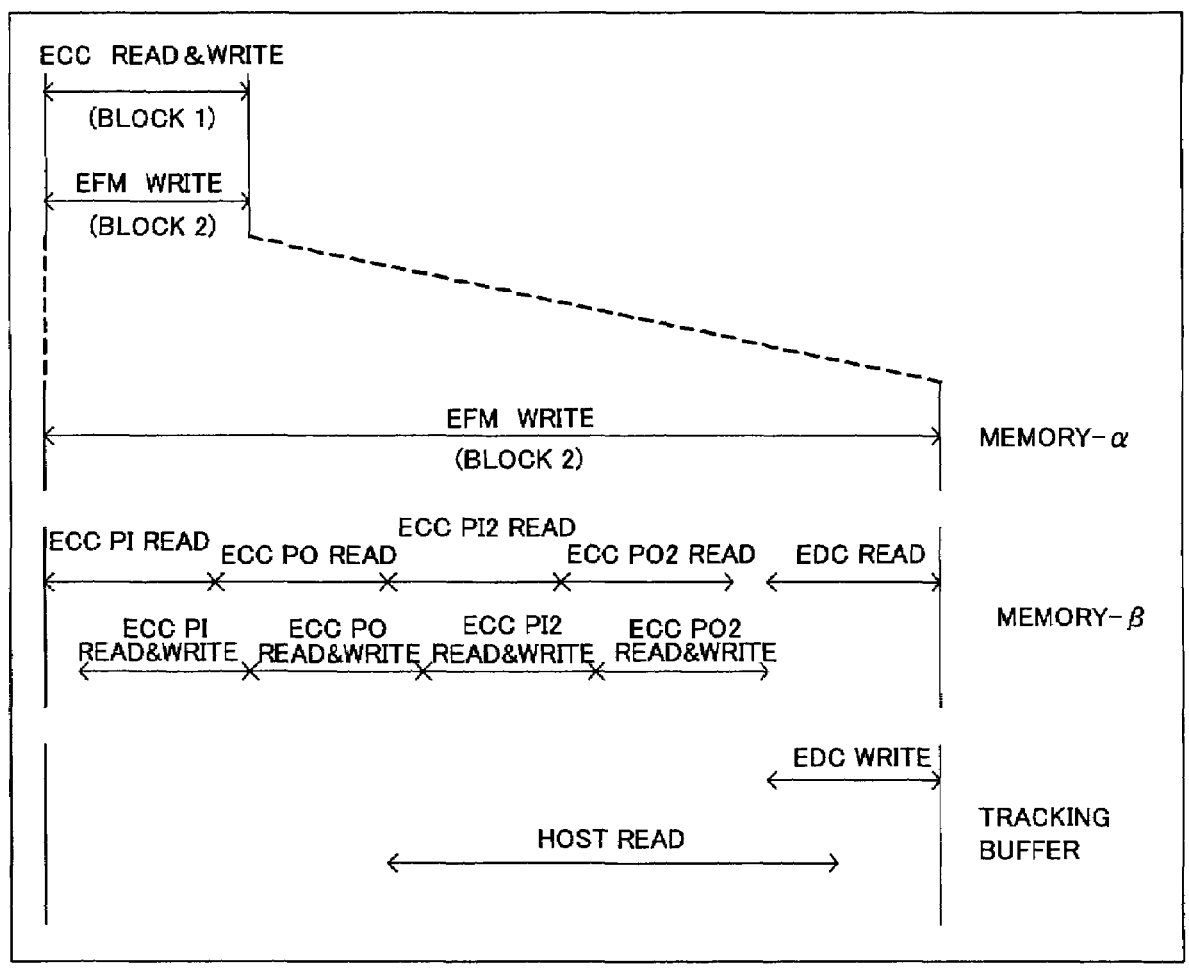
FIG. 28 is a diagram showing the state of memory access at the time of decoding in a circuit according to an embodiment of the present invention.
Figure 29:
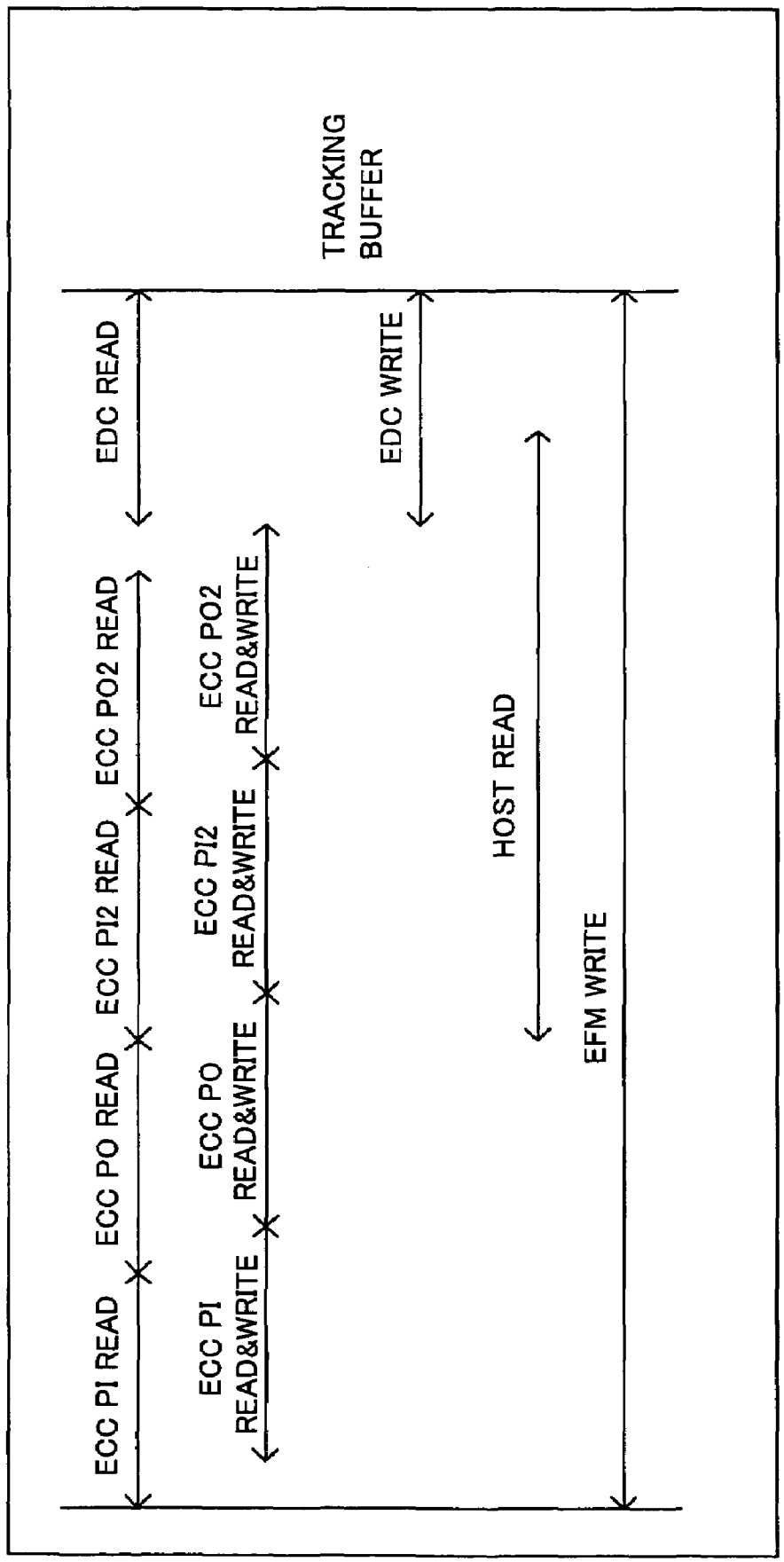
FIG. 29 is a diagram showing the state of memory access in a conventional circuit.

Here, the state of memory access will be compared between the circuit according to the present embodiment and the conventional circuit. FIG. 28 is a diagram of the state of memory access of the circuit according to the present embodiment; and FIG. 29 is a diagram of the state of memory access of the conventional circuit. Both show the situation when the PI and PO are repeated two times for the correction.

In the conventional circuit shown in FIG. 29, the access such as EFM-WR, ECC PI-RD, ECC PO-RD, ECC PI2-RD, ECC PO2-RD, ECC PI-RD&WR, ECC PO-RD&WR, ECC PI2-RD&WR, ECC PO2-RD&WR, EDC-RD, EDC-WR, HOST-WR, HOST-RD, EFM-WR are generated with respect to a single memory. As opposed to this, in the circuit according to the present embodiment shown in FIG. 28, the memory accesses are carried out dispersed to three memories, so a bottleneck of the memory access is relieved. In FIG. 28, the memory α is accessed for the EFM-WR, the memory β is accessed for the ECC PI-RD, ECC PO-RD, ECC PI2-RD, ECC PO2-RD, ECC PI-RD&WR, ECC PO-RD&WR, ECC PI2-RD&WR, ECC PO2-RD&WR, and EDC-RD, and the tracking buffer is accessed for the EDC-WR and HOST-RD.

In general, when there are accesses overlapping in time, arbitration of the access right to the memory becomes necessary. In that case, overhead occurs accompanied with the access right arbitration. In FIG. 29, all accesses are concentrated at a single memory, so this overhead becomes large. On the other hand, in FIG. 28, there are few overlapping memory accesses and the overhead is small. When confirming the memory accesses for FIG. 28, the memory α is accessed only for the EFM-WR, so arbitration is not required. The tracking buffer is only accessed for the EDC-WR and HOST-RD so the number of continuous accesses can be made large and the overhead can be made small. The memory β is accessed for the ECC processing and the EDC processing, but the two processings are sequentially carried out, so arbitration of the access right is not necessary. For the ECC, the code read operation and the error correction processing overlap in time, but there are few accesses for the error correction processing (Read & Write), so the overhead is still small. Further, there are accesses for the codes, but there is almost no overlap in time, so the overhead is still small. The tracking buffer is written with the decoded data. The host interface circuit 1154 transfers the decoded data to the host apparatus 117 according to a transfer request from the host apparatus 117.

Figure 30:
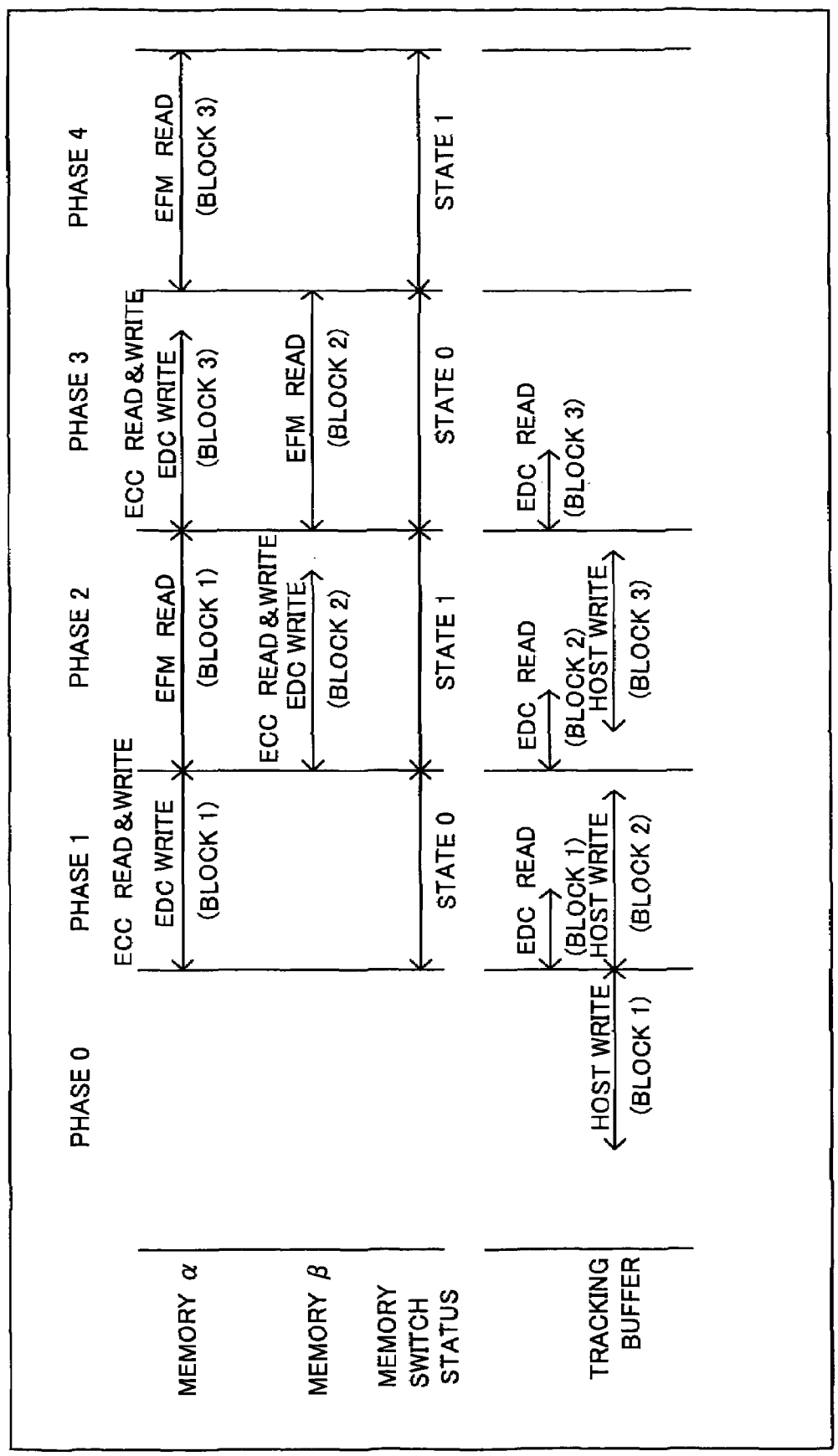
FIG. 30 is a diagram for explaining encoder pipeline processing.

Next, an explanation will be given of the encoder pipeline processing with reference to FIG. 30 while referring to FIG. 4. At phase 0, when the user data is input from the host apparatus 117 to the host interface circuit 1154, the user data is written into the tracking buffer 11553 through the second bus 11562. Address information and parity information other than the user data are sometimes input too, but in that case, the address generation and the parity generation operation are omitted. When the write operation of the user data is ended, the encoding starts.

At this time, the state is the initial state, therefore the bus portion 1156 of the decoder/encoder circuit 115 is actively supplied with the status information ST0, and the bus portion 1156 is in the state 0 status. Accordingly, the connection path of the decoder/encoder circuit 115 is formed as shown in FIG. 25.

At phase 1, the tracking buffer 11553 reads out the user data, and the EDC circuit 11532 performs the scrambling, the EDC parity generation, the ID generation, various types of information generation, etc. and writes the scrambled user data, EDC parity, ID, and various types of field information into the memory α. The EDC parity generation and the scrambling are simultaneously executed. This is possible since the data read sequences are similar between two processings. The scrambled data is not written back to the original memory, but is written into the tracking buffer. For this reason, the EDC data read processing from the tracking buffer and the EDC data write processing into the memory α (first memory) are simultaneously executed. The EDC parity is added to the data stored in the memory α. The memory access of the encoding is accompanied by the read operation of the PI code, the rewrite processing of the parity portion of the PI code, the read operation of the PO code, and the parity portion rewrite processing of the PO code.

At phase 2, the read operation with respect to the data stored in the memory α and the EFM+ modulation with respect to the read data are carried out. The data subjected to the EFM+ modulation is output as a binarized signal, and the write processing to the disc is carried out. When the read operation for the EFM+ modulation ends, the state changes to the state 1, and the connection path of the decoder/encoder circuit 115 is formed shown in FIG. 26.

On the other hand, the memory β (second memory) is subjected to the write processing of the scrambled user data, EDC parity, ID, and various types of field information, the ECC parity addition processing, etc.

At phase 3, the memory α is subjected to the write processing of the scrambled user data, EDC parity, ID, and various types of field information, the ECC parity addition processing, etc. On the other hand, the data read operation for the EFM+demodulation with respect to the data stored in the memory β is carried out.

At phase 4, there is no data remaining in the tracking buffer, so the ECC parity addition processing etc. are not carried out. On the other hand, the data read operation for the EFM+ demodulation with respect to the data stored in the memory α is carried out.

Figure 31:
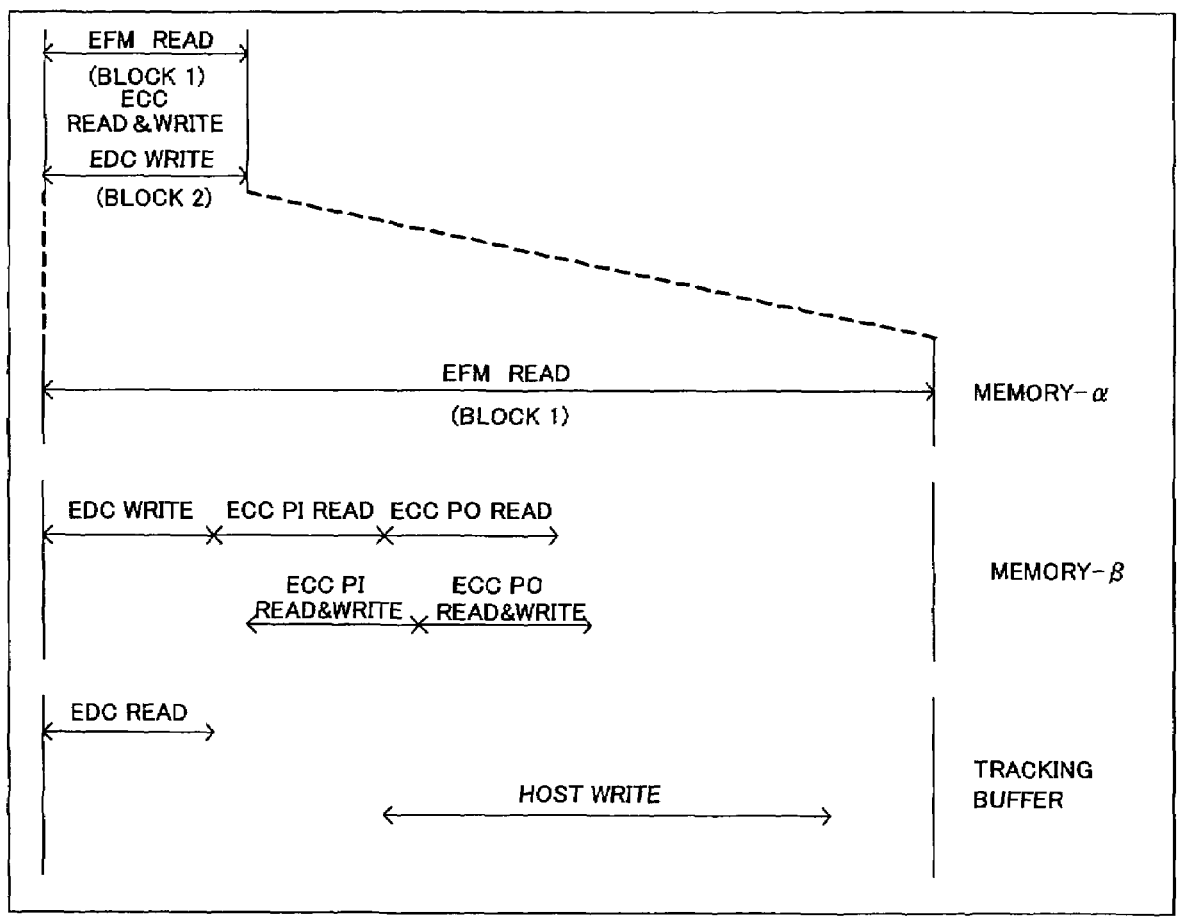
FIG. 31 is a diagram showing the state of memory access at the time of encoding in a circuit according to an embodiment of the present invention.
Figure 32:
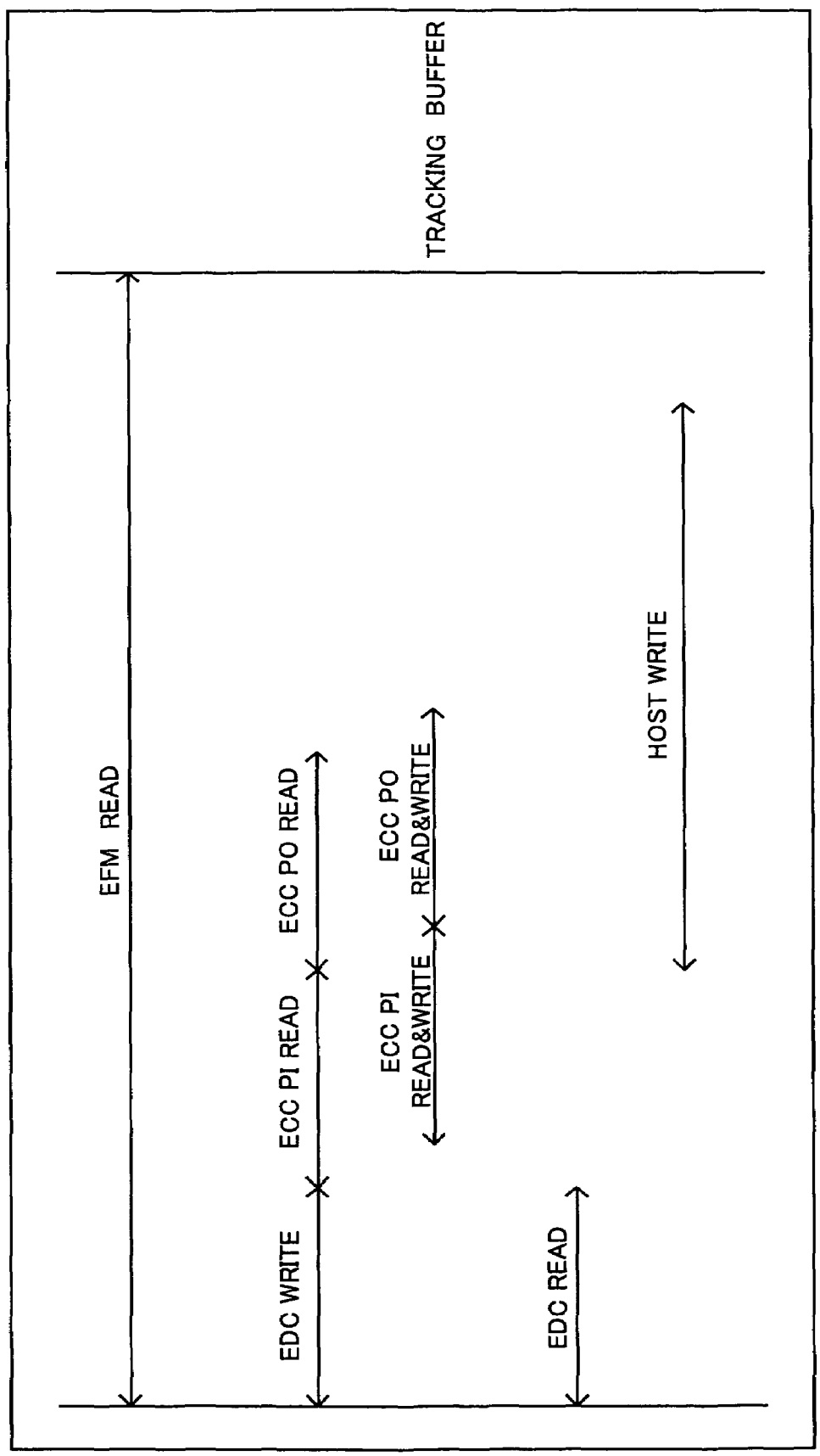
FIG. 32 is a diagram showing the state of memory access in a conventional circuit.

Here, the state of memory access will be compared between the circuit according to the present embodiment and the conventional circuit. FIG. 31 is a diagram of the state of memory access of the circuit according to the present embodiment; while FIG. 32 is a diagram of the state of memory access of the conventional circuit. The two diagrams show the situation when the encoding is carried out.

In the conventional circuit of FIG. 32, a single memory is accessed for the EFM-RD, EDC-WR, ECC PI-RD, ECC PO-RD, ECC PI-RD&WR, ECC PO-RD&WR, HOST-WR, EDC-RD, EFM-RD, etc.

As opposed to this, in the circuit according to the present embodiment of FIG. 31, the memory accesses are carried out dispersed to three memories, so the bottleneck of the memory access is eased. In FIG. 31, the memory α is accessed for the EFM-RD, the memory β is accessed for the EDC-WR, ECC PI-RD, ECC PO-RD, ECC PI-RD&WR, and ECC PO-RD&WR, and the tracking buffer 11553 is accessed for the HOST-WR and EDC-RD.

In general, when a memory is accessed overlapping in time, arbitration of the access right to the memory becomes necessary. In that case, overhead occurs accompanied with the access right arbitration. In FIG. 32, all accesses are concentrated at a single memory, so this overhead becomes large.

On the other hand, in FIG. 31, there are few overlapping memory accesses and the overhead is small. When confirming the accesses for FIG. 31, the memory α is accessed only for the EFM-RD, so arbitration is not required. The tracking buffer 11553 is only accessed for the EDC-RD and HOST-WR so the number of continuous accesses can be made large and the overhead can be made small. The memory β is accessed for the EDC processing and the ECC processing, but the two processings are sequentially carried out, so arbitration of the access right is not necessary. For the ECC, the code read operation and the parity rewrite processing overlap in time, but there are few accesses for the parity rewrite processing (Read & Write), so the overhead is still small. Further, there are accesses for the codes, but there is almost no overhead in time, so the overhead is still small.

As explained above, according to the present embodiment, provision is made of the comparator 1101 for converting the forward phase signal RFAC and the inverse phase signal XRFAC to the binarized signals, the edge position measurement unit 1102 for measuring the edge position in the time axis of the binarized signal S1101 supplied from the comparator 1101 by the multi-phase clock from the multi-phase VCO 11021, the jitter measurement unit 1104 for measuring the amount of jitter based on the edge position information S1102 from the edge position measurement unit 1102, the edge interval measurement unit 1105 for measuring the edge interval length based on the edge position information S1102 from the edge position measurement unit 1102, the propagation delay difference control amount calculation unit 1106 for controlling the propagation delay difference between the input and output of the comparator 1101 by injecting for example the slice level voltage of the comparator 1101 through the DAC 1107 based on the amount of jitter from the jitter measurement unit 1104 and the edge interval length from the edge interval measurement unit 1105, and the channel data discrimination unit 1103 for reproducing the data corresponding to the channel clock based on the edge position information S1102 from the edge position measurement unit 1102, so the following effects can be obtained.

Namely, the signal input to the channel data discrimination unit 1103 and the signal used for calculating the propagation delay error control amount have the same precision, therefore making the propagation error measurement amount 0 leads to the best channel data discrimination precision and high precision control can be carried out. Further, even if there is temperature fluctuation, voltage fluctuation, aging etc. of the analog circuit components, the correction can be carried out while performing the signal reproduction, and the control is made by the digital processing without using the waveform information of the signal, so there are few error factors. Still further, variations in production of the analog circuit components can be corrected, and the number of the components realized by the analog circuits is small. Accordingly, there are the advantages that the propagation delay difference and the error factor can be reduced, high precision binarization control can be realized, and accordingly high precision reproduction can be realized.

Further, according to the present embodiment, the configuration was made so that, at the time of reproducing the data, the data in units of blocks after the EFM+ demodulation at the EFM demodulator 1151 supplied through the data path of the bus portion 1156 formed in accordance with the status information ST0 and ST1 were alternately written to the first memory and the second memory, the recording data was read out to the error corrector 1153 through the data path of the bus portion 1156 formed in accordance with the status information ST0 or ST1 from the first memory or the second memory to which the data has not be written, the data in the error correction (EDC) was written into the first memory or the second memory, the data after ending the error correction was stored in the third memory (tracking memory), and at the time of recording the data, the user data transferred in units of blocks from the host apparatus 117 was written into the third memory (tracking memory) as the tracking buffer via the bus portion 1156, after the start of the encoding, the user data stored in the third memory was read out by the error corrector 1153, the user data, the EDC parity, and various types of field information scrambled at the error corrector 1153 were alternately written into the first memory and the second memory for each block unit through the data path of the bus portion 1156 formed in accordance with the status information ST0 and ST1, and the data stored in the first memory or the second memory was read out by the EFM+ modulator 1152. By configuring the apparatus in this way, the following effects can be obtained.

Namely, when performing the pipeline processing, the memory is shared by the pipeline stages, so there is no memory access for the transfer of the data. Further, when performing the pipeline processing, at a certain time, the memory is occupied at each pipeline stage, there are few memory accesses with respect to one memory. Accordingly, high speed operation is possible, and lowering of the power compensation is possible. Further, the output stage of the system has the memory serving as the buffer, therefore, even if there is no data request of the data, the pipeline operation will not be interrupted, and the high speed operation is possible. Still further, a request of change of the size of the memory serving as the buffer required for the system due to the application can be easily coped with by replacing only the portion accessing the same buffer memory.

Further, the present embodiment is configured so that, when storing the data in the first memory 11551 and the second memory 11552, they are encrypted with the predetermined key and stored, and when reading the data, the data is decoded by using the key at the time of the encrypting, therefore, even if there is a pipeline stage for which the writing of the data is not correctly carried out, the data of the portion for which the writing was not carried out becomes erroneous data in the other pipeline stage, so malfunction will not occur. Further, in the optical disc device, even if there is data which is not buffered due to the disturbance of the PLL at the time of EFM-WR, and the disturbance of the synchronization protection etc., the reduction of the error correction capability will not occur. Further, in the optical disc device, there is the advantage that the EDC check does not unjustly become good and result in an erroneously output of data to the host apparatus 117 even if there is data which is not buffered due to the disturbance of the PLL at the time of EFM-WR, disturbance of the synchronization protection, etc.

While the invention has been described with reference to specific embodiments chosen for purpose of illustration, it should be apparent that numerous modifications could be made thereto by those skilled in the art without departing from the basic concept and scope of the invention.

I claim:

1. An information processing apparatus for reading and reproducing recording data from a medium recording data of a predetermined format therein, comprising:

a binarizing means for binarizing read data from said medium;

an edge measuring means for measuring an edge position of the binarized data from said binarizing means;

a jitter measuring means for measuring the coded jitter information from the measured edge position;

an edge interval measuring means for measuring an edge interval from the measured edge position;

a propagation delay difference control amount calculation means in which the jitter information from the jitter measuring means and the edge interval from said edge interval measuring means are added to each other so as to generate a propagation delay difference control amount;

a controlling means for controlling a difference between a rising propagation delay and a falling propagation delay of said binarized data so that the reproduction state is improved, based on the propagation delay difference control amount; and a channel data discriminating means for discriminating a channel data from the measured edge position.

2. An information processing apparatus as set forth in claim 1, wherein:

said binarizing means performs binarization processing based on a predetermined slice level, and said control means controls said slice level of said binarizing means to control the difference between the rising propagation delay and the falling propagation delay of said binarized data.

3. An information processing apparatus as set forth in claim 1, wherein said control means controls a drive ability of binarized data of said binarizing means to control the difference between the rising propagation delay and the falling propagation delay of said binarized data.

4. An information processing apparatus as set forth in claim 1, wherein:

said apparatus further has a propagation path selecting means for selecting said binarized data, and said control means selects a propagation path of said binarized data based on the jitter information from said jitter measuring means and the edge interval from said edge interval measuring means to control the difference between the rising propagation delay and the falling propagation delay of said binarized data.

5. An information processing apparatus for reading recording data from a medium recording data of a predetermined format therein and recording the input data as the data of the predetermined format on said medium, comprising:

a binarizing means for binarizing read data from said medium;

an edge measuring means for measuring an edge position of the binarized data from said binarizing means;

a jitter measuring means for measuring coded jitter information from the measured edge position;

an edge interval measuring means for measuring the edge interval from the measured edge position;

a propagation delay difference control amount calculation means in which the jitter information from the jitter measuring means and the edge interval from said edge interval measuring means are added to each other so as to generate a propagation delay difference control amount;

a controlling means for controlling a difference between a rising propagation delay and a falling propagation delay of said binarized data so that the reproduction state is improved, based on the propagation delay difference control amount;

a channel data discriminating means for discriminating the channel data from the measured edge position;

a demodulation circuit for demodulating the read data from said channel data discriminating means; a processing circuit for performing a predetermined decode processing and encode processing of an error correction code with respect to the data after said demodulation;

a modulation circuit for modulating said encoded data and outputting the same as the recording data to said medium;

a memory portion including at least one memory capable of storing data having at least a capacity required in each of pipeline stages and accessed by any circuit of said demodulation circuit, processing circuit, and modulation circuit; and a bus portion for switching a data path between said demodulation circuit and processing circuit and the memory of said memory portion in accordance with predetermined status information and performing the transfer of the data between pipeline stages.

6. An information processing apparatus as set forth in claim 5, wherein said path portion switches said data path between said demodulation circuit and processing circuit and the memory of said memory portion in accordance with status information of transition from the state of processing of at least one circuit among said demodulation circuit and error processing circuit.

* * * * *